United States Patent
Nakamura et al.

(10) Patent No.: US 6,756,262 B1
(45) Date of Patent: Jun. 29, 2004

(54) SEMICONDUCTOR INTEGRATED CIRCUIT DEVICE HAVING SPACED-APART ELECTRODES AND THE METHOD THEREOF

(75) Inventors: Yoshitaka Nakamura, Ome (JP); Isamu Asano, Iruma (JP); Satoru Yamada, Ome (JP); Tsugio Takahashi, Hamura (JP); Yuzuru Ohji, Hinode (JP); Masayoshi Hirasawa, Hachiouji (JP); Takashi Yunogami, Niiza (JP); Tomonori Sekiguchi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/708,450

(22) Filed: Nov. 9, 2000

(30) Foreign Application Priority Data

Nov. 11, 1999 (JP) ............................................ 11-320725

(51) Int. Cl.[7] .......................................... H01L 21/8249
(52) U.S. Cl. ...................................... 438/240; 438/253
(58) Field of Search ................................. 438/240, 253, 438/396, 387, 244, 238, 239, 386; 257/302, 303, 296, 306, 310

(56) References Cited

U.S. PATENT DOCUMENTS

| | | | | |
|---|---|---|---|---|
| 5,142,437 A | * | 8/1992 | Kammerdiner et al. | ..... 361/313 |
| 5,218,512 A | * | 6/1993 | Nakamura | ................... 361/321 |
| 5,827,766 A | * | 10/1998 | Lou | ............................ 438/253 |
| 5,837,578 A | * | 11/1998 | Fan et al. | .................... 438/254 |
| 5,854,104 A | * | 12/1998 | Onishi et al. | ............... 438/240 |
| 6,010,943 A | * | 1/2000 | Liao | ............................ 438/397 |
| 6,150,706 A | * | 11/2000 | Thakur et al. | .............. 257/532 |
| 6,177,361 B1 | * | 1/2001 | Gilton | ........................ 438/785 |
| 6,316,802 B1 | * | 11/2001 | Schindler et al. | ........... 257/306 |
| 6,319,765 B1 | * | 11/2001 | Cho et al. | ................... 438/240 |

FOREIGN PATENT DOCUMENTS

| | | |
|---|---|---|
| JP | 10335581 | 12/1998 |
| JP | 11145410 | 5/1999 |

\* cited by examiner

*Primary Examiner*—Eddie Lee
*Assistant Examiner*—Douglas W. Owens
(74) *Attorney, Agent, or Firm*—Antonelli, Terry, Stout & Kraus, LLP

(57) ABSTRACT

Conduction reliability between a capacitor upper electrode and a plug connected to an upper layer wire is kept high to prevent connection defects and to reduce the resistance of the capacitor upper electrode. In a capacitor of a DRAM comprising a lower electrode 45 made of ruthenium, a capacitor insulating film 50 made of BST and an upper electrode 49, the upper electrode 49 has a laminate structure comprising a ruthenium film 47 formed on the side of the capacitor insulating film 50 and a tungsten film 48 formed over the former.

13 Claims, 29 Drawing Sheets

SEMICONDUCTOR INTEGRATED CIRCUIT DEVICE HAVING SPACED-APART ELECTRODES AND THE METHOD THEREOF

BACKGROUND OF THE INVENTION

This invention relates generally to a semiconductor device and to the production thereof. More particularly, this invention relates to technology that is effective when applied to a semiconductor device having a DRAM (Dynamic Random Access Memory).

Memory cells of a DRAM are generally arranged at points of intersection between a plurality of word lines and a plurality of bit lines that are arranged in the form of a matrix on a main plane of a semiconductor substrate. Each memory cell comprises one MISFET (Metal Insulator Semiconductor Field Effect Transistor) for selecting the memory cell and one information storage capacitance device (capacitor) connected in series with this MISFET.

The MISFET for selecting the memory cell is formed in an active region encompassed by a device isolation region, and comprises mainly a gate oxide film, a gate electrode formed integrally with a word line and a pair of semiconductor regions constituting a source and a drain. Generally, two of such MISFETs are formed in one active region, and one of the source/drain (semiconductor regions) of these two MISFETs is shared at the center of the active region. The bit line is disposed over the MISFET and is connected electrically to the semiconductor region thus shared. The capacitor is disposed likewise over the MISFET and is connected electrically to the other source/drain.

Japanese Patent Laid-open No. 7084/1995, for example, discloses a DRAM having a Capacitor-Over-Bit-line (COB) structure formed by disposing the capacitors over the bit lines. The DRAM described in this reference employs a structure in which a lower electrode (accumulation electrode) of each capacitor arranged over the bit line is processed into a cylindrical shape, and a capacitance insulating film and an upper electrode (plate electrode) are formed on this lower electrode. Being shaped into a cylindrical shape, the surface of the lower electrode can be increased so as to supplement the decrease of the storage charge quantity (Cs) of the capacitor resulting from miniaturization of the memory cell. In the memory cell having such a COB structure, cubing of the capacitor structure to a certain extent is essentially necessary in order to secure the desired operation reliability as a semiconductor memory device.

It is anticipated, however, that even the cubing of the capacitor structure will not be sufficient to secure the necessary capacitance value (storage charge quantity) in the latest semiconductor devices that are highly integrated, particularly in those which have a capacity of 256 Mbit (megabit) or more.

The journal "Applied Physics", Vol. 65, No. 11, pp. 1111–1112, published by the Society of Applied Physics, Nov. 10, 1996, examines the possibility of the use of high dielectric materials (ferroelectric materials), such as tantalum oxide ($Ta_2O_5$) or STO ($SrTO_3$) or BST ($Ba_xSr_{1-x}TO_3$), for the insulating film of the capacitor. $Ta_2O_5$ has a specific inductive capacity of as high as about 20, and STO and BST have an extremely high specific inductive capacity of about 200 to about 500. Therefore, if these high dielectric constant films are used, a higher capacitance value could be acquired more easily than the silicon oxide film and the silicon nitride film that have been used in the past. STO and BST, in particular, have a high dielectric constant, and are therefore expected to exhibit a remarkable effect of increasing the capacitance value.

Film formation of STO and BST is conducted in an oxidizing atmosphere. Therefore, when the silicon materials that have been used in the past are used for the capacitor electrode, a silicon oxide film having a low dielectric constant is formed undesirably on the electrode interface. For this reason, the possible use of Ru (ruthenium), Pt (platinum), $RuO_2$ (ruthenium oxide), etc, having a high oxidation resistance has been examined as the electrode material for the capacitor.

SUMMARY OF THE INVENTION

However, the inventors of this invention have confirmed that the following problems arise when precious metals, such as Ru, Pt, etc, or their suicides or oxides, are used for the electrode materials, particularly for the upper electrode. The problems that will be explained below are not particularly known in the art, but have been discovered as a result of experiments conducted by the present inventors. Incidentally, the term "precious metal" as used in this specification refers to gold (Au), silver (Ag) and platinum group metals (ruthenium (Ru), rhodium (Rh), palladium (Pd), osmium (Os), iridium (Ir) and platinum (Pt)).

The first problem is that when a precious metal is used for the upper electrode, the electric connection between a contact portion (through-hole plug) with the upper layer wire and the upper electrode becomes unstable, or a connection defect arises.

The first cause of this problem is oxygen contained in the precious metal that forms the upper electrode. A CVD process is employed when the film of the precious metal such as Ru or Pt is formed. Since the starting gas contains oxygen in this CVD process, the resulting precious metal film contains oxygen, too. Also, the re is the case where the film constituent elements contain oxygen from the beginning such as in the case of $RuO_2$. To open a through-hole for the connection to the upper electrode in an inter-layer insulating film covering the upper electrode, a photoresist film is used generally. However, when this photoresist film is removed by ashing, the upper electrode (film made of the precious metal) below the through-hole absorbs oxygen in the ashing atmosphere. When heat-treatment is conducted after the through-hole plug is formed, oxygen in the film reacts with the metal constituting the plug and forms a metal oxide. The plug comprises generally a barrier metal such as titanium nitride and a main conductor layer such as tungsten. In this case, titanium in the barrier metal reacts with oxygen and forms titanium oxide having a high resistivity. Since such titanium oxide is formed structurally between the upper electrode and the plug, the electric contact between the upper electrode and the plug is impeded, so that the problem of unstableness (drop of connection reliability) of the electric connection described above occurs.

The second cause is that an etching selection ratio cannot be balanced substantially between the precious metal constituting the upper electrode and a silicon oxide film serving as the inter-layer insulating film that covers the upper electrode. The through-hole for the connection to the upper electrode is formed when the opening is bored in the silicon oxide film serving as the inter-layer-insulating film. Dry etching of the silicon oxide film is generally conducted using a photoresist film as a mask to bore this opening. In this instance, since the etching selection ratio cannot be balanced sufficiently between the silicon oxide film and the precious metal constituting the lower electrode, the through-hole is formed in such a fashion as to penetrate through the upper electrode. Since the through-hole is so formed as to penetrate through the upper electrode in this way, the contact and the area between the plu upper electrode inside the through-hole becomes small and the problem of the drop of connection reliability develops. It may be possible to control the etching time so that etching can be completed on the surface of the upper electrode, but this method is difficult in actual practice for the following reasons. The supply of power to the upper electrode is provided from its upper layer wire through the through-hole plug. However, the supply of power or the connection of the wire from the upper layer wire is made also to the wire (first layer wire) that is formed in the same wire layer as the bit lines. In other words, two or more kinds of through-holes, that is, the through-hole for the plug for the connection to the upper electrode and the through-hole for the plug for the connection to the first layer wire, exist. Since the bit line (first layer wire) is formed below the capacitor, the depth of the through-hole for the connection to the upper electrode is smaller than the depth of the through-hole for the connection to the first layer wire. When the separate process steps are conducted to form these two kinds of through-holes, the number of the process steps increases. It is therefore unavoidably necessary to process them simultaneously. Consequently, when etching is stopped on the surface of the upper electrode, the through-hole reaching the first layer wire cannot be formed. When the through-hole reaching the first layer wire is bored, on the contrary, the through-hole must be formed unavoidably in such a fashion as to penetrate through the upper electrode as long as the etching selection ratio cannot be secured for the upper electrode.

When the through-hole is so formed as to penetrate through the upper electrode, and particularly when the upper electrode is made of a material that evaporates in the oxidizing atmosphere (such as Ru or $RuO_x$), the upper electrode below the through-hole is etched in the step (ashing step) of removing the photoresist film after the through-hole processing (etching), and is recessed in some cases from the section of the through-hole. In this case, even when the plug is formed after the formation of the through-hole, normal contact cannot be established because the material of the lower electrode is recessed from the through-hole section, inviting a connection defect. The problem of the evaporation of the lower electrode material due to ashing or the problem of etching occurs also when the through-hole does not penetrate through the lower electrode, but is more critical than when it penetrates through the lower electrode.

The second problem is that the resistance value of the upper electrode cannot be lowered when a precious metal is used for the upper electrode. Fluctuation of the upper electrode potential (reference potential) occurs under the transient state at the time of read-out of the memory cell. Unless the resistance value of the upper electrode is lowered, the influences of such a transient fluctuation are great. In consequence, the possibility of a read error exists. From the aspect of cut-off of the external noise, too, the resistance value of the upper electrode is preferably small.

The reason why such a problem occurs is because the film thickness of the precious metal cannot be increased. The precious metals have a large internal stress (compressive stress), and if the film thickness is increased, degradation of the capacitor characteristics occurs due to the influences of the stress.

It is an object of the invention to provide a semiconductor integrated circuit device that has a high connection reliability between a capacitor upper electrode and a plug connected to an upper layer wire, and is free from the occurrence of a connection defect.

It is another object of the invention to provide a semiconductor integrated circuit device that can reduce the resistance of the capacitance upper electrode.

These and other objects and novel features of the invention will become more apparent from the following description in this specification when taken in connection with the accompanying drawings.

The outline of typical features embodiments described in this application will be briefly described as follows.

According to one aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor and the second electrode are connected by a connection member (through-hole plug), wherein the connection member contains a metal which degrades its conductivity upon oxidation, the second electrode includes a first layer (lower layer) and a second layer (upper layer), and the second layer contains oxygen to such an extent that oxygen does not form a metal oxide, or the resulting metal oxide does not impede electric conduction between the second layer and the connection member. Alternatively, the second layer does not contain oxygen.

In such a semiconductor integrated circuit device, the second layer does not contain oxygen, or even when it does, oxygen is contained in such an amount that a metal oxide that impedes electric conduction is hardly formed. In consequence, the material that impedes electric conduction is hot formed between the second layer and the connection member, and the connection reliability between the upper electrode of the capacitor and the through-hole plug can be improved. As a result, the reliability of the semiconductor integrated circuit device can be improved.

Incidentally, the connection member can include a barrier layer made of titanium nitride or an adhesive layer. If the upper electrode coming into contact with the connection member contains oxygen, oxygen reacts with titanium inside the titanium nitride because the connection member contains titanium nitride (TiN), and forms titanium oxide (TiO) that impede electric conduction. In accordance with the present invention, however, the second layer does not contain oxygen or contains it in only a limited amount even when it does. Therefore, titanium oxide (TiO) is not formed, and connection between the connection member and the second layer can be kept satisfactory. In other words, connection between the second electrode and the connection member can be kept satisfactory.

In accordance with the invention, the connection member may be formed in such a fashion as to penetrate through the second electrode. In such a case, too, a good connection can be established at least between the second layer and the connection member even though connection between the first layer and the connection member is not satisfactory. Eventually, connection between the second electrode and the connection member can be kept satisfactory.

According to another aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor and the second electrode are connected by a connection member (through-hole plug), wherein the second electrode includes a first layer (lower layer) and a second layer (upper layer), and the second layer is made of a material having a lower etching rate than that of a material constituting the first layer under the condition where an insulating film is etched.

According to such a semiconductor integrated circuit device, the second layer is allowed to function as an etching stopper during the etching process in which a connection hole (through-hole) is bored in an inter-layer insulating film (silicon oxide film, for example) on the second layer. Consequently, it becomes possible to prevent penetration of the through-hole through the second electrode and to improve the connection reliability between the through-hole plug and the second electrode. The second layer can be formed simultaneously with a connection hole having a greater hole depth (for example, a connection hole connected to a first layer wire formed below the capacitor), and the connection hole formation step can be simplified.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor and the second electrode are connected by a connection member (through-hole plug), wherein the second electrode includes a first layer (lower layer) and a second layer (upper layer), and the second layer is made of a material having a higher oxidation resistance than a material constituting the first layer, or a material having a smaller evaporation rate in an oxidizing atmosphere.

According to such a semiconductor integrated circuit device, the second layer has a high oxidation resistance or a small evaporation rate in the oxidizing atmosphere. Therefore, damage and evaporation of the second layer can be restricted in the photoresist-removing step (ashing step) after processing of the through-hole. In this case, even when the first layer is made of a material having a low oxidizability or having an evaporation property in the oxidizing atmosphere (ruthenium, for example), the second layer functions as a blocking film in the ashing atmosphere, and etching or evaporation of the first layer can be prevented.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film), and in which a wire (second layer wire) on the capacitor and a second layer are connected by a connection member (through-hole plug), wherein the second electrode includes a first layer (lower layer) and a second layer (upper layer), and the second layer is made of a material having a lower resistivity than the material constituting the first layer.

According to such a semiconductor integrated circuit device, the second layer uses a material having a low resistivity. Therefore, the resistance value of the second electrode can be reduced and the performance of the semiconductor integrated circuit device can be improved.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film), and in which a wire (second layer wire) on the capacitor and the second electrode are connected by a connection member (through-hole plug), wherein the second electrode includes a first layer (lower layer) and a second layer (upper layer), and the internal stress of the second electrode is lower than the internal stress when the second layer is constituted by the material constituting the first layer.

According to such a semiconductor integrated circuit device, a laminate film of a second layer material (tungsten, for example) and a first layer material that constitutes the second electrode can more greatly reduce the internal stress than when the second electrode is constituted as a whole by the first layer material (ruthenium, for example). The precious metal used as the first layer material has generally a large internal stress, and when the second electrode is constituted by such a precious metal, the capacitor characteristics (such as a leakage current) increase, resulting in a degradation of the refresh performance of the DRAM. This semiconductor integrated circuit device can avoid such a problem because the internal stress can be reduced.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor and the second electrode are connected by a connection member (through-hole plug), wherein the second electrode includes a first layer (lower layer) and a second layer (upper layer), and the angle between a taper surface and a base in a processing section when the second layer material is processed by anisotropic dry etching is greater than the angle between the taper surface and the base in the processing section of the first layer material under the same etching condition.

In other words, the second electrode material has a higher etchability than the first electrode material. Therefore, the etchability of the second electrode comprising the first and second layers is higher than that of the second electrode made solely of the first layer material.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor, and the second electrode are connected by a connection member (through-hole plug), wherein the second electrode includes a first layer (lower layer) and a second layer (upper layer), the first electrode is shaped into a columnar or cylindrical cubic shape, the film thickness T1 of the first layer satisfies the condition $T1>(d-2\times Tins)/2$, and the film thickness T2 of the second layer satisfies the condition $T2>T1$, where d is the distance between adjacent first electrodes or a cylindrical inner diameter of the first electrode, and Tins is the film thickness of the capacitance insulating film.

From the condition $T1>(d-2\times Tins)/2$, the first layer must have a film thickness sufficient to bury at least concavoconvexities resulting from the lower electrode (first electrode) and the capacitor insulating film. Since the first layer is generally made of a precious metal such as ruthenium, its film thickness is preferably made as small as possible so long as it can satisfy the condition described above, in order to reduce the internal stress. On the other hand, the film thickness of the second layer is greater than that of the first layer from the condition T2>T1, so as to secure sufficient conductivity and to reduce the stress of the second electrode as a whole.

According to still another aspect of the invention, there is provided a semiconductor integrated circuit device which includes a capacitor comprising a first electrode (lower electrode), a second electrode (upper electrode) and a capacitance insulating film (ferroelectric body or high dielectric film) and in which a wire (second layer wire) on the capacitor and the second electrode are connected by a connection member (through-hole plug), wherein the second electrode includes a first layer (lower layer) and a second layer (upper layer), and the end portions of the first and second layers are processed into a taper shape. This sectional shape can be formed in such a fashion that the distance from the end (leg) of the vertical drawn from the upper end of the taper surface to the surface of the base to the lower end of the taper surface is at least ½ of the minimum processing size.

Since the end portions of the first and second layers are thus processed into a taper shape, the reliability of the semiconductor integrated circuit device and its production yield can be improved. The first layer (made of a precious metal such as ruthenium) has lower etchability than the second layer. Therefore, a side film having a low evaporation property (such as ruthenium oxide) is formed on the etching section of the first layer. When the subsequent process step is continued under such a condition where the side film exists, the side film peels off from the etching section and changes to dust in the washing step, and so forth. The dust becomes the factor that undesirably lowers the production yield of the semiconductor integrated circuit device. For this reason, the present invention etches the second electrode into a taper shape lest the side film is formed. This means can restrict the occurrence of dust and can improve the production yield of the semiconductor integrated circuit device and its reliability.

Incidentally, in the semiconductor integrated circuit device described above, the first layer can be a precious metal film, a silicide or oxide film of the precious metals or their compound film. Examples of the first layer include a platinum film, a ruthenium film, a ruthenium silicide film and an SRO (SrRuO$_x$) film. In this instance, the capacitance insulating film may be a BST (Ba$_x$Sr$_{1-x}$TiO$_3$) film, an STO (SrTiO$_3$) film or a tantalum oxide (Ta$_2$O$_5$) film.

The first layer can be a titanium nitride film while the capacitance insulating film can be a tantalum oxide (Ta$_2$O$_5$) film.

The second layer can be a metal film of an element belonging to the Groups IVb, Vb and VIb, their nitride film, their silicide film or their compound film. Examples of the second layer is a tungsten (W) film, a titanium (Ti) film, a tantalum (Ta) film, a tungsten nitride (WN) film, a titanium nitride (TiN) film, a tantalum nitride (TaN) film, a titanium aluminum nitride (TiAlN) film, a titanium silicon nitride (TiSiN) film, a tungsten silicon nitride (WSiN) film and a tantalum silicon nitride (TaSiN) film. These metal films or metal compound films are superior in oxidation resistance and etching resistance to the material of the first layer, and have a lower resistivity and lower stress. When these materials are used for the second layer, the functions described above can be accomplished.

The second electrode may further include a third layer comprising a titanium nitride film or a titanium compound film such as a titanium silicon nitride film in addition to the first and second layers. The titanium nitride film has the function of absorbing hydrogen and can exhibit the function as a hydrogen barrier after the capacitor is formed. The metal oxide material is used for the capacitor insulating film, as described above, and the diffusion of hydrogen is not preferable. When the titanium nitride film is formed in this way, the performance of the capacitor insulating film can be kept at a high level.

The first electrode can comprise a film of precious metals or their silicide or oxide film, or their compound film. Examples include a platinum film, a ruthenium film, a ruthenium silicide film and an SRO (SrRuO$_x$) film.

The semiconductor integrated circuit device includes a local wire in the same layer as the second electrode. This local wire is formed by the same process step as the second electrode. Since the second electrode, the resistance of which is lowered by using the second layer, is used for the wire, the second electrodes (plate electrodes) between the memory mats, for example, can be connected to one another without using an upper layer wire. As a consequence, the number of through-holes extending to the upper layer wires can be reduced, the freedom of layout can be improved and a higher integration density of the semiconductor integrated circuit device can be accomplished.

A method of producing a semiconductor integrated circuit device according to the invention comprises the step of forming bit lines and first layer wires on a MISFET on a main plane of a semiconductor substrate through a first inter-layer insulating film, forming a second inter-layer insulating film and an electrode-forming insulating film, and boring holes in the electrode-forming insulating film; forming a metal or a metal compound for burying the inside of the holes, removing the electrode-forming insulating film or forming a metal film or a metal compound film covering the inner wall of the holes, and forming a columnar or cylindrical first electrode; depositing a ferroelectric or high dielectric capacitance insulating film to cover the first electrode, and depositing further a first conductor layer and a second conductor layer; etching the first and second conductor layers to form a second electrode; and depositing a third inter-layer insulating film covering the second electrode, and forming first connection holes reaching the second electrode and second connection holes reaching the first layer wire by etching; wherein the second layer functions as an etching stopper from the time at which the bottom portion of the first connection holes reaches the second electrode until the time at which the bottom portion of the second connection holes reaches the first layer wire.

In the step of etching the second electrode, the first layer is etched by using the second layer, that is patterned, as a mask after the second layer is etched.

This production method can produce the semiconductor integrated circuit device described above.

DESCRIPTION OF THE PREFERRED EMBODIMENTS

Figure 1:
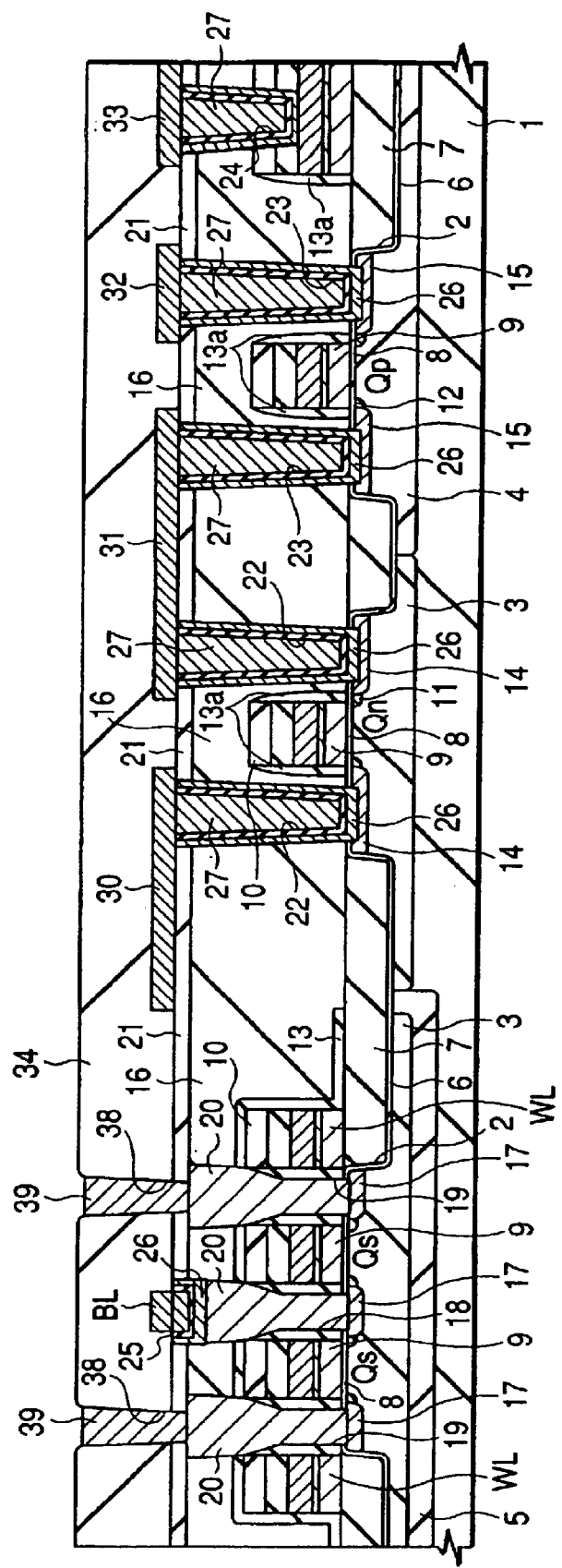
FIGS. 1 to 10 and FIGS. 12 to 19 are sectional views each showing step-wise a production process of manufacture of a DRAM according to an embodiment (Embodiment 1) of the invention.

Hereinafter, preferred embodiments of the invention will be explained in detail with reference to the accompanying drawings. Incidentally, the same reference numeral will be used throughout all of the drawings to identify a constituent element having the same function, and repetition of the explanation of such an element will be omitted.

Embodiment 1

FIGS. 1 to 19 are sectional views each showing step-wise a method of production of a DRAM (Dynamic Random Access Memory) according to the first embodiment of the present invention. Incidentally, the left-hand portion of each drawing, that shows the section of a substrate, depicts a region in which a memory cell of the DRAM is to be formed (memory cell array), and the right-hand portion depicts a peripheral circuit-region.

First, a selection MISFET Qs of a memory cell, and n-channel MISFET Qn and p-channel MISFET Qp of a peripheral circuit are formed over a semiconductor substrate (hereinafter called merely the "substrate") 1 as shown in FIG. 1. Bit lines BL and first layer wires 30 to 33 are formed over these MISFET Qs, Qn and Qp.

A device isolation trench 2 is formed in the substrate 1. After a thin silicon oxide film 6 is formed by wet oxidation or dry thermal oxidation, a silicon oxide film 7, for example, is buried into the device isolation trench 2. The silicon oxide film 7 is then polished by CMP (Chemical Mechanical Polishing), for example, in such a fashion as to leave it inside the device isolation trench 2 and to form a device isolation region. A p- or n-type ion is injected into the substrate 1 to form a p-type well and an n-type well 5 in the substrate 1 of the memory cell array, while the p-type well 3 and the n-type well 4 are formed in the substrate 1 of the peripheral circuit region. A clean gate oxide film 8 is formed on the surface of each of the p-type well 3 and the n-type well 4 by thermal oxidation at about 800° C.

The MISFET Qs, Qn and Qp are formed in the following way. Polycrystalline silicon film doped with an impurity is deposited onto the gate oxide film 8 by a CVD process, for example. A WN film and a W film are then deposited by sputtering, for example. A silicon oxide film is further deposited by CVD. Heat-treatment is then conducted to mitigate the stress of the W film and to densify the WN film. A silicon nitride film is deposited further on the silicon oxide film. This silicon nitride film is patterned into a gate electrode pattern. The silicon oxide film, the W film, the WN film and the polycrystalline silicon film are dry etched using the nitride silicon film as a mask. In consequence, gate electrodes 9 comprising the polycrystalline silicon film, the WN film and the W film are formed. A cap insulating film 10 comprising a silicon oxide film and a silicon nitride film is formed on these gate electrodes 9. Incidentally, each gate electrode 9 formed in the memory cell array functions as a word line WL.

Next, an n-type impurity (phosphorus or arsenic) is ion-implanted into the p-type wells 3 on both sides of the gate electrode 9, forming n⁻-type semiconductor regions 11. A p-type impurity (boron) is ion-implanted into the n-type well 4, forming p⁻-type semiconductor regions 12. After a silicon nitride film 13 is deposited onto the substrate 1, the upper part of the substrate 1 of the memory cell array is covered with a photoresist film (not shown), and the silicon nitride film 13 of the peripheral circuit region is etched anisotropically, forming side wall spacers 13a on the side walls of the gate electrodes 9 of the peripheral circuit region. An n-type impurity (phosphorus or arsenic) is ion-implanted into the p-type well 3 of the peripheral circuit region, forming an n⁺-type semiconductor region 14 (source and drain). A p-type impurity (boron) is ion-implanted into the n-type well 4, forming a p⁺-type semiconductor region 15 (source and drain). As a result of the process steps described so far, an n-channel MISFET Qn and a P-channel MISFET Qp equipped with an LDD (Lightly Doped Drain) structure in the peripheral circuit region are formed.

Next, a silicon oxide film 16 (a TEOS oxide film, for example) is deposited onto the gate electrode 9. The surface of this silicon oxide film 16 is polished and planarized by CMP. The silicon oxide film 16 of the memory cell array is dry etched using a photoresist film (not shown) as a mask, and a silicon nitride film 13 below the silicon oxide film 16 is dry etched. Contact holes 18 and 19 are bored by the etching process conducted in these two stages. An n-type impurity (phosphorus or arsenic) is ion-implanted into the p-type well 3 (n⁻-type semiconductor region 11) of the memory cell array through the contact holes 18 and 19, forming an n⁺-type semiconductor region 17 (source and drain). As a result of the process steps described so far, a memory cell selection MISFET Qs of the n-channel type is formed in the memory cell array. A polycrystalline silicon film doped with an impurity is buried into the contact holes 18 and 19 to form a plug 20. This plug 20 is formed by etch-back of the polycrystalline silicon film that is buried (or by polishing by CMP). After a silicon oxide film 21 is deposited onto the upper part of the silicon oxide film 16 by CVD, for example, the silicon oxide film 21 of the peripheral circuit region and the silicon oxide film 16 below the former are dry etched by dry etching using a photoresist film (not shown) as a mask. In consequence, contact holes 22, 23, 24 and 25 are formed at the upper part of the n⁺-type semiconductor region 14, the p⁺-type semiconductor region 15, the gate electrode 9 and the contact hole 18 of the memory cell array. A silicide film 26 is formed at the bottom of each contact hole 22, 23, 25. A plug 27 is formed inside each contact hole 22, 23, 24, 25. To form the silicide film 26, the Ti film and the TiN film are deposited first and then the substrate 1 is heat-treated at about 650° C. To form the plug 27, the TiN film and the W film are first deposited by CVD, for example, and are then polished by CMP in such a fashion as to leave them only inside the contact holes 22, 23, 24 and 25.

Next, a bit line BL is formed on the silicon oxide film 21 of the memory cell array to form the first layer wires 30 to 33 on the silicon oxide film 21 of the peripheral circuit region. The bit line BL and the first layer wires 30 to 33 are formed in the following way. A W film is first formed on the silicon oxide film 21 by sputtering, for example, and this W film is dry etched using a photoresist film as a mask.

A silicon oxide film 34 is formed over the bit line BL and the first layer wires 30 to 33. This silicon oxide film 34 is formed in the same way as the silicon oxide film 16. Through-holes 38 are bored in the silicon oxide film 34 in the following way. After a polycrystalline silicon film is deposited onto the silicon oxide film 34 by CVD, it is patterned. Sidewall spacers are formed on the side walls of the polycrystalline silicon film so patterned, and etching is then conducted using the side wall spacer and the polycrystalline silicon film as a mask. Since the sidewall spacer, too, is used as a mask in this way, the through-holes 38 can be formed in a processing size below the resolution limit of exposure.

A plug 39 is formed inside each through-hole 38 in the following way. A low resistance polycrystalline silicon film doped with an n-type impurity (phosphorus) is deposited onto the upper part of the silicon oxide film 34 inclusive of the inside of the through-hole 38 by CVD. This polycrystalline silicon film is etched back in such a fashion as to leave it only inside the through-hole 38. To form a barrier film 40 to be explained with reference to the next step, this etch-back is conducted somewhat excessively so that the surface of the plug 39 is lower than the surface of the silicon oxide film 34, or in other words, a recess can be formed at the upper part of the through-hole 38.

Figure 2:
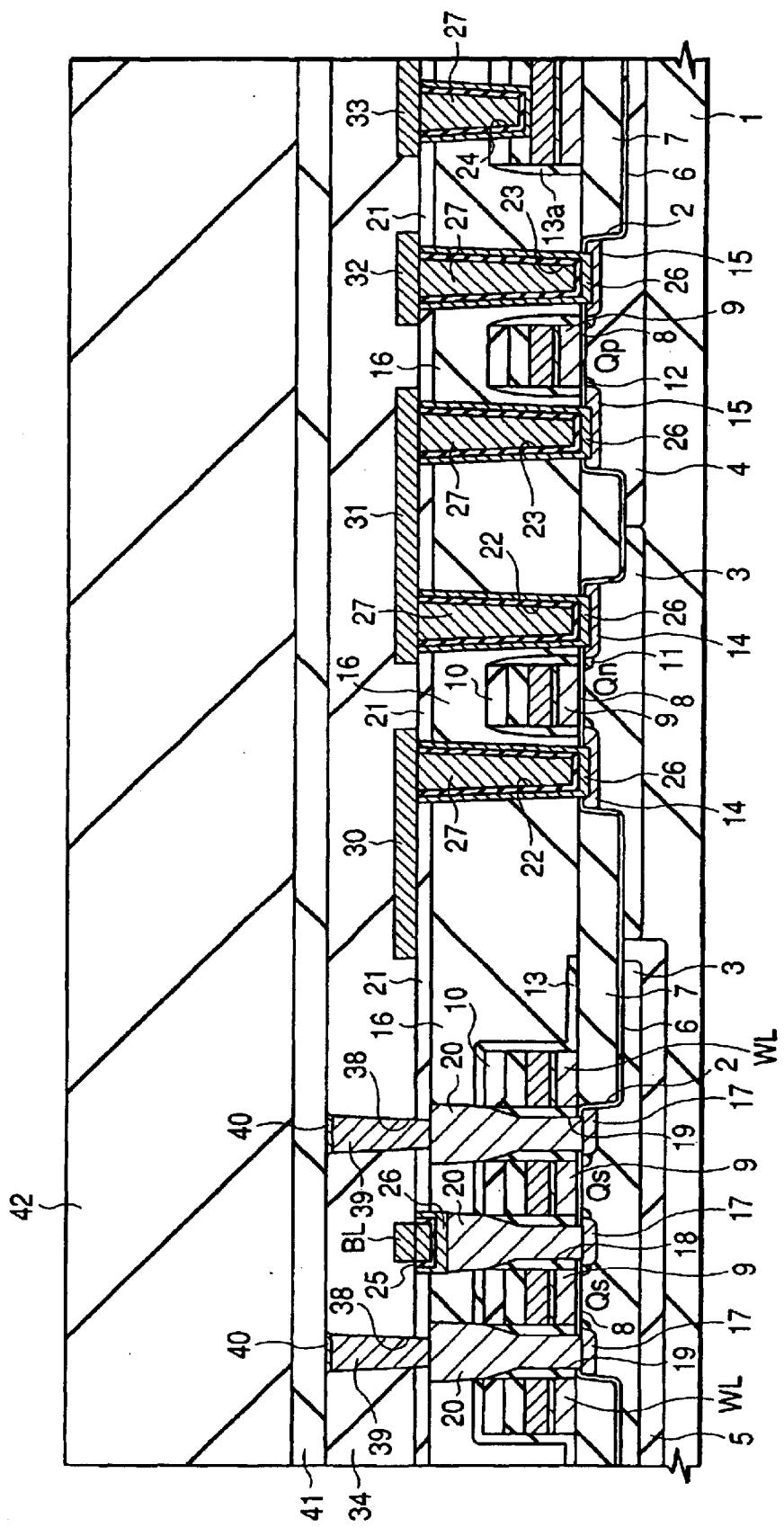

Next, after a barrier film 40 is formed over the plug 39 as shown in FIG. 2, a silicon nitride film 41 and a silicon oxide film 42 are serially deposited over the silicon oxide film 34.

Examples of the material of the barrier film 40 are tungsten (W), tungsten nitride (WN), titanium nitride (TiN), tantalum nitride (TaN), titanium aluminum nitride (TiAlN), titanium silicon nitride (TiSiN), tantalum silicon nitride (TaSiN), tungsten silicon nitride (WSiN), ruthenium silicide (RuSi), tungsten boride (WB), titanium boride (TiB), tungsten carbide (WC), titanium carbide (TiC), and so forth. The barrier film 40 using such a material has the function of blocking diffusion of oxygen in an oxidation process of a capacitor insulating film that will be explained later. This function will be explained later in detail.

The barrier film 40 is formed in the following way, for example. The film of the material of the barrier film 40 is formed over the surface of the plug 39 and the silicon oxide film 34 by CVD or sputtering and is polished by CMP in such a fashion as to leave the barrier film 40 only inside the recess on the plug 39(or over the through-hole 38).

A silicon nitride film 41 and a silicon oxide film 42 can be formed by CVD, for example. The silicon nitride film 41 is formed in order to maintain the mechanical strength of the lower electrode that will be explained later. The thickness of the silicon nitride film 41 is 100 nm, for example. The silicon oxide film 42 is used for forming the lower electrode that will be explained later. The thickness of the silicon oxide film 42 is the factor that determines the height of the lower electrode, and can be determined by conducting an inverse calculation from the capacitance value required for the capacitor. Assuming that the lower electrode has a pillar shape of 0.13 µm and a BST film is used as the capacitor insulating film having an effective film thickness of 0.4 nm calculated as the silicon oxide film, the film thickness of the silicon oxide film 42 is 700 nm. In consequence, the height of the portion contributing as the capacitor of the lower electrode is 700 nm, and the capacitance value of 40 fF can be secured for the capacitor.

Figure 3:
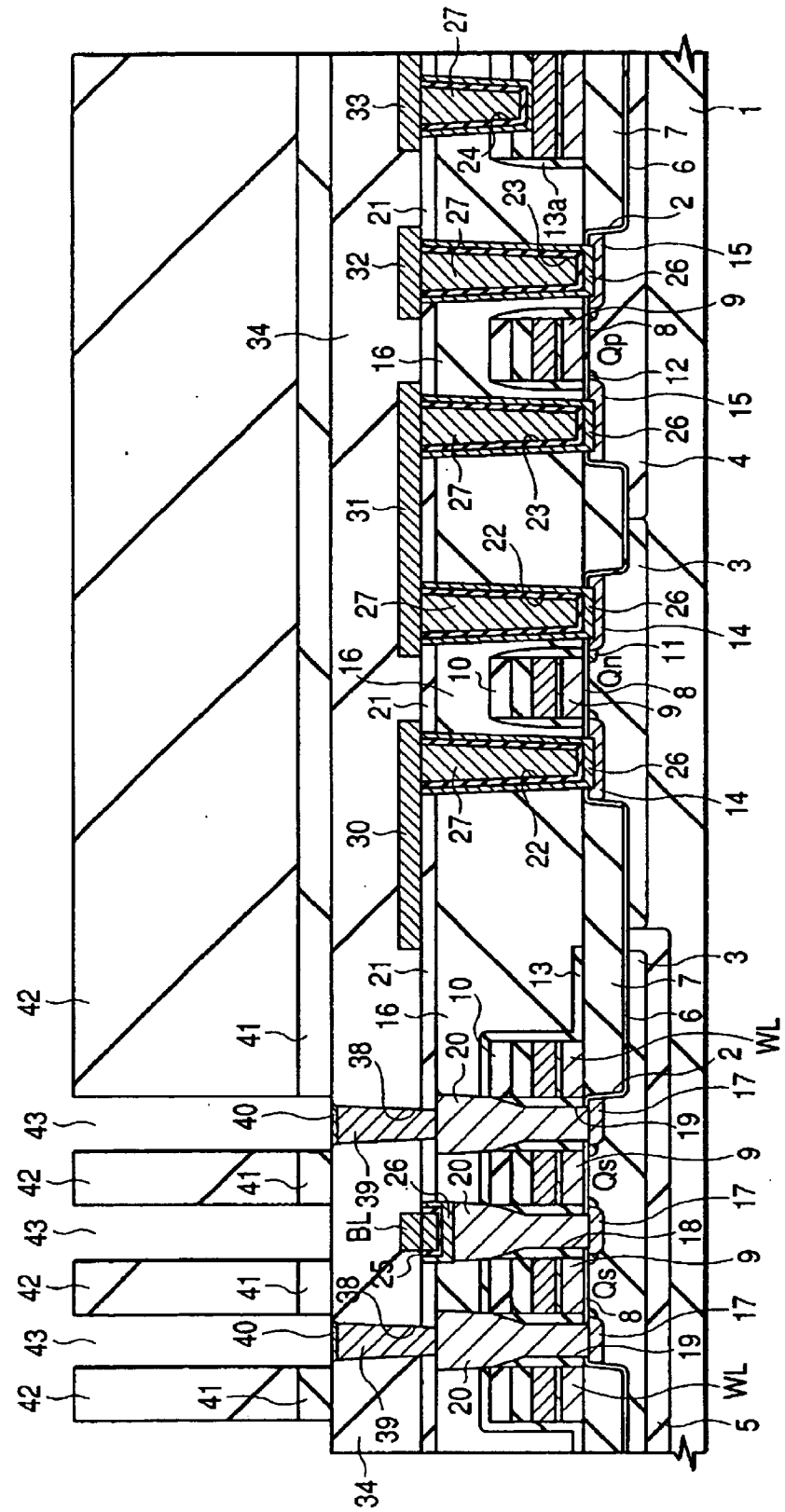

Next, holes 43 are bored in the silicon oxide film 42 and the silicon nitride film 41 as shown in FIG. 3. To form the holes 43, a photoresist film (not shown) is first formed on the silicon oxide film 42 and is then patterned. Since this embodiment uses polishing by CMP for forming the silicon oxide film 34, the silicon oxide film 34 has high planarity. Consequently, the silicon oxide film 42 has high surface planarity, too, and exposure to the photoresist film formed on this silicon oxide film 42 can be conducted: precisely. The photoresist film is used for forming the lower electrode and must be patterned in the minimum processing size. Therefore, high exposure preciseness is extremely advantageous for patterning the photoresist film. The photoresist film is patterned in an aperture diameter of 0.13 µm, for example. Next, the silicon oxide film 42 and the silicon nitride film 41 are etched with this photoresist film as the mask to form the holes 43. This etching can be conducted in two stages. The first etching is conducted under the condition where the silicon oxide film can be etched but the silicon nitride film cannot be etched easily. The silicon oxide film 42 is etched under a sufficient over-etching condition. In this instance, the silicon nitride film 41 functions as the etching stopper. The second etching is then conducted under the condition where the silicon nitride film can be etched. Since the silicon nitride film 41 is formed to a sufficiently smaller film thickness than the silicon oxide film 42, the silicon oxide film 34 as the base is not etched excessively even when over-etching is applied to a certain extent. Therefore, the holes 43 having a very small aperture diameter can be processed highly precisely even when the aspect ratio is high.

Figure 4:
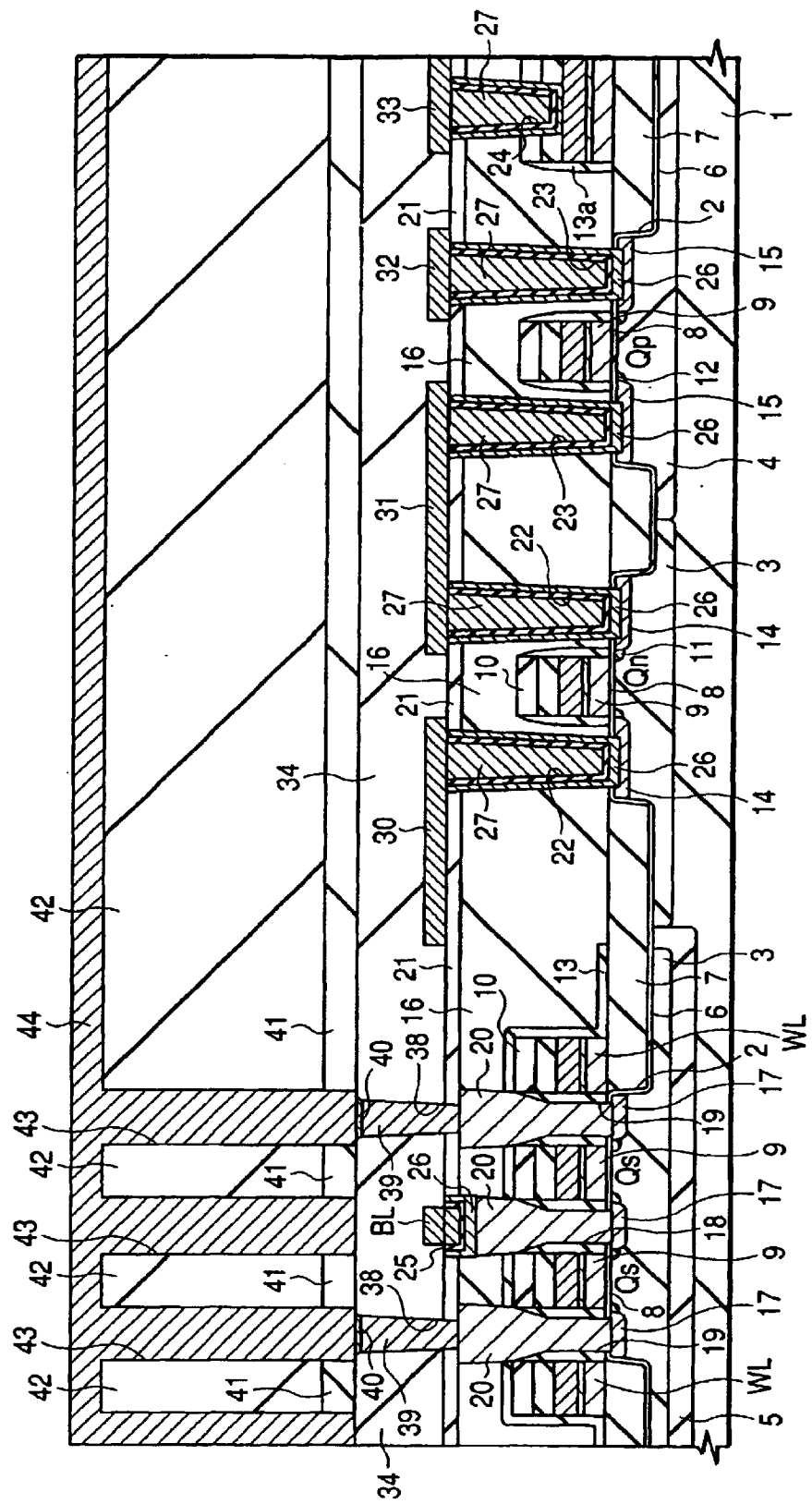

Next, a ruthenium film 44 is formed in such a fashion as to bury the holes 43 as shown in FIG. 4. The ruthenium film 44 has a thickness of 100 nm to 200 nm, for example. The CVD process is employed for forming the ruthenium film 44. Ru(BtCp)$_2$/THF and O$_2$ are used at flow rates of 0.5 sccm and 50 sccm, respectively, as the source (starting material) gases. Here, BtCp is a butylcyclopenta group (C$_5$H$_8$(C$_4$H$_9$)—). THF is tetrahydrofuran (C$_4$H$_{11}$O), and functions as a solvent.

Since the ruthenium film 44 is deposited by CVD as described above, the holes 43 can be buried excellently with a very fine and high aspect ratio. Though this embodiment uses typically the ruthenium film 44, platinum can be used in place of ruthenium. When platinum is deposited by CVD, (MeCp)Pt(Me)$_3$ and O$_2$ can be used as the source (starting material) gases. Here, Me is a methyl group (CH$_3$—) and MeCp is a methylcyclopenta group (C$_5$H$_8$(C$_4$H$_9$)—).

A ruthenium film may be formed to a thickness of about 25 nm to 100 nm by sputtering before the ruthenium film 44 is deposited by CVD. In this case, the ruthenium film formed by sputtering functions as the seed film, and the formation of the ruthenium film 44 becomes easier.

Figure 5:
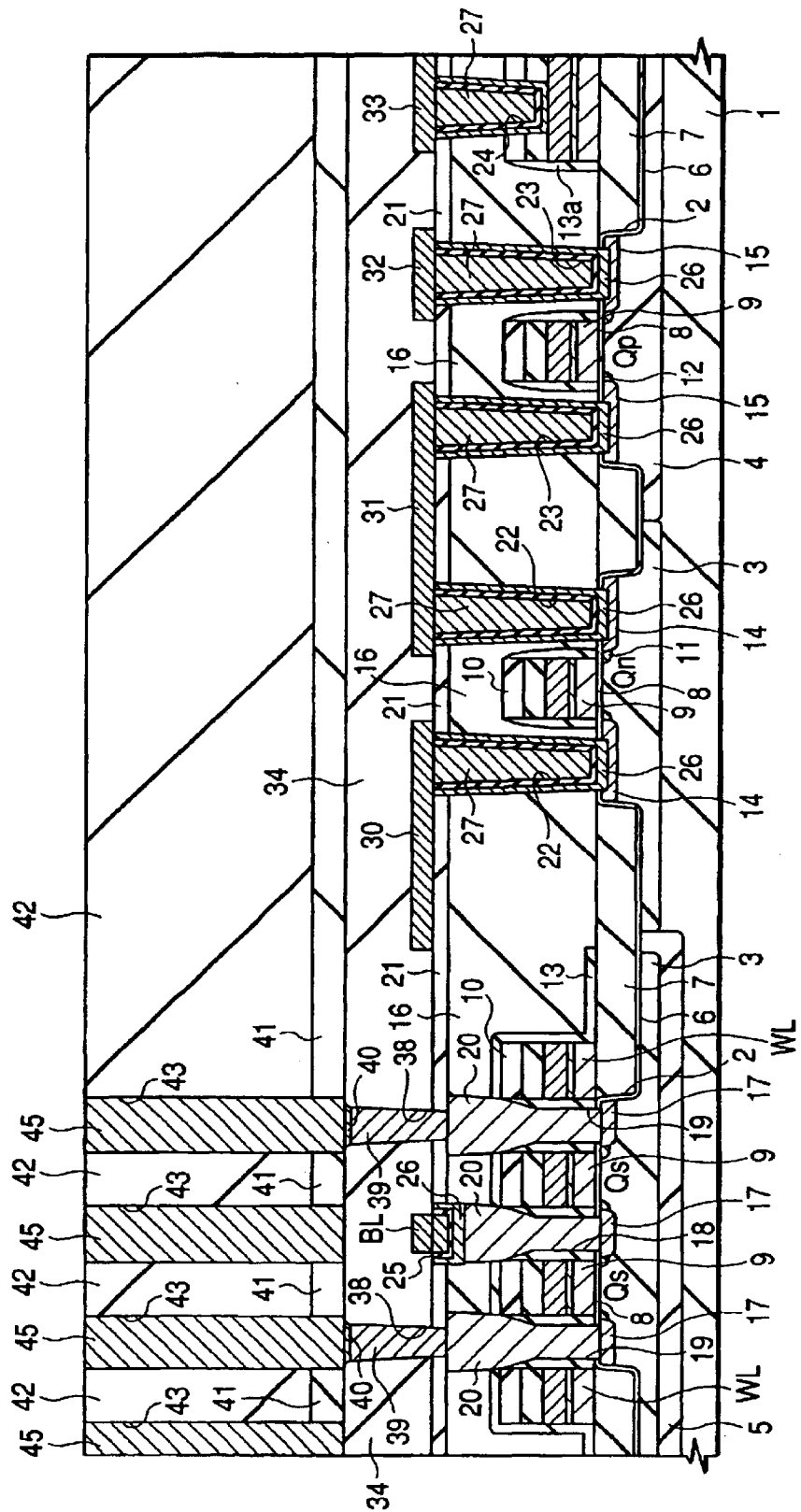

Next, the ruthenium film 44 on the silicon oxide film 42 is etched back and removed as shown in FIG. 5, and the lower electrode 45 is so formed as to leave the ruthenium film 44 only inside the holes 43. CMP may be used in place of etching-back.

Incidentally, heat-treatment may be carried out to densify (harden) ruthenium after the lower electrode 45 is formed. This heat-treatment can mitigate the stress of the lower electrode 45 (ruthenium).

Figure 6:
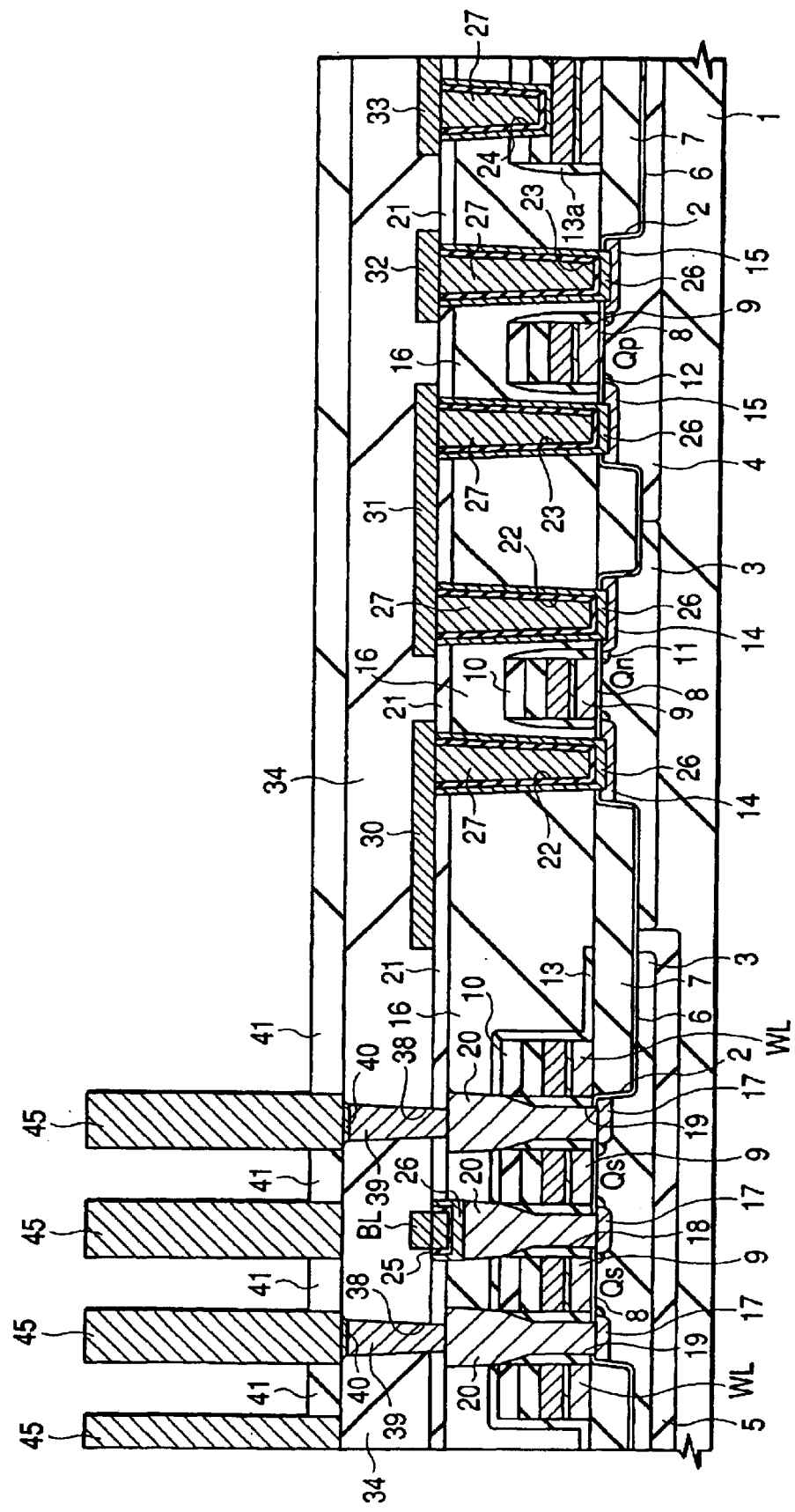

Next, the silicon oxide film 42 is removed to expose the side surface of the lower electrode 45 as shown in FIG. 6. Wet etching, for example, is used to remove the silicon oxide film 42. In this instance, the silicon nitride film 41 functions as an etching stopper.

Figure 7:
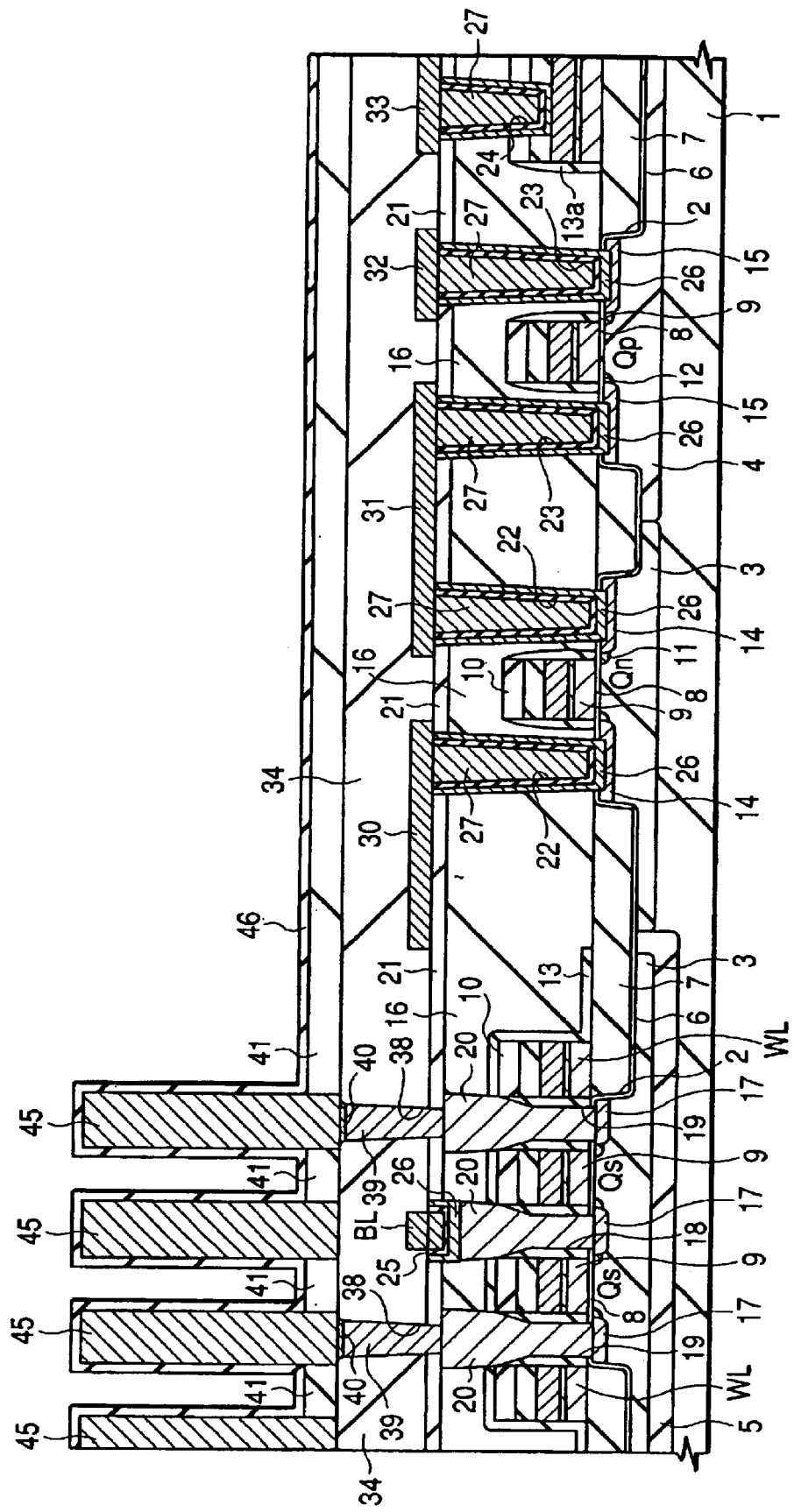

A BST film 46 is then formed as shown in FIG. 7. This BST film 46 functions as the capacitor insulating film of the DRAM. The BST film 46 is formed by CVD to a thickness of 20 nm to 30 nm, for example. Since the BST film 46 under the as deposited state contains a large number of oxygen defects, oxidation heat-treatment is conducted to recover the oxygen defects. This oxidation heat-treatment is conducted at a temperature within the range of 500° C. to 700° C. in an oxygen atmosphere, for example. Though this embodiment uses an oxygen atmosphere, the oxidizing atmospheres such as nitrogen oxides (NO, $N_2O$), ozone ($O_3$), and so forth, may be used besides oxygen. Since this embodiment uses ruthenium for the lower electrode 45, a dielectric is not formed in the interface between the lower electrode 45 and the BST film 46 due to the formation of the BST film 46 and due to the subsequent oxidation treatment. In other words, oxygen or the oxygen-containing gas is used as the starting material to deposit the BST film 46, and active oxygen permeates through the BST film 46 and reaches the interface with the lower electrode 45 in the oxygen treatment. Consequently, the surface of the lower electrode 45 is oxidized and an oxide of ruthenium (ruthenium oxide) is formed on the interface between the lower electrode 45 and the BST film 46. However, ruthenium oxide is an electrically conductive material and the effective film thickness of the capacitance insulating film does not increase due to the formation of the oxide. Particularly because the dielectric constant of the BST film 46 is high, a great merit can be obtained in that an insulating film having a low dielectric constant is not formed.

Figure 8:
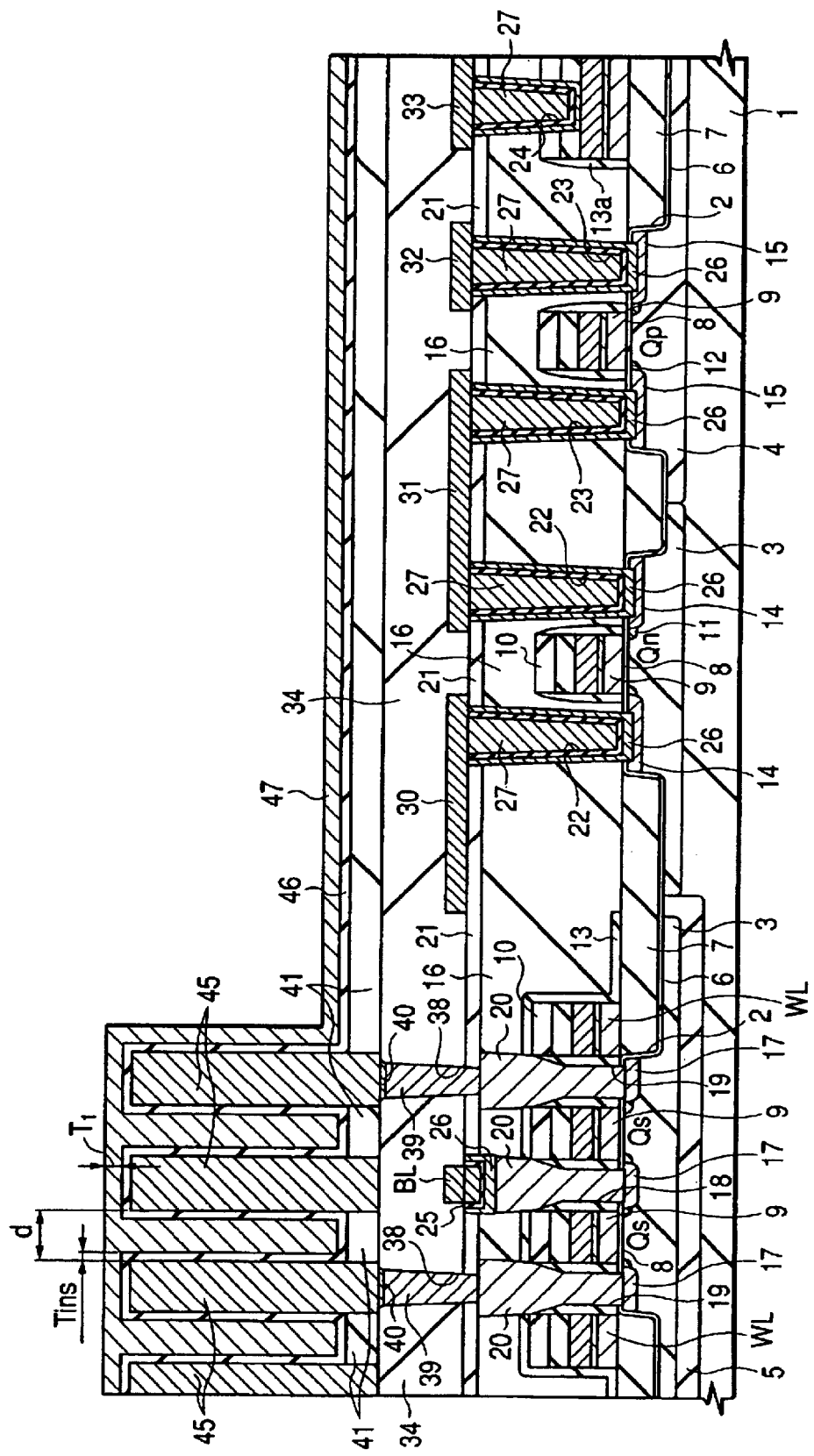

Next, a ruthenium layer 47 as the first layer is formed as shown in FIG. 8. The ruthenium film 47 constitutes the upper electrode of the DRAM capacitor in cooperation with a tungsten film (second layer) 48 that is to be explained next. The ruthenium film 47 is formed by CVD in the same way as the ruthenium film 44 described above. Incidentally, a platinum film may be used for the first layer in the same way as described above. When CVD is employed, the spaces between the lower electrodes 45 processed very delicately can be buried in an excellent way.

Since the CVD process described above uses oxygen ($O_2$) as the source gas, the ruthenium (or platinum) film 47 contains oxygen. Oxygen contained in such a metal is likely to form a metal compound (e.g. titanium oxide) with the metal constituting the plug to be formed in a subsequent process step of the prior art method, and to invite conduction defects. Since the second layer is formed in this embodiment as will be explained later, however, such a defect does not occur.

The ruthenium film 47 is formed to a thickness sufficient to bury the spaces between the lower electrodes 45. Since the BST film 46 has been formed already inside the holes 43, the ruthenium film 47 must have a thickness that is at least half (e.g. 35 nm) of the balance (e.g. 0.07 $\mu$m) obtained by subtracting double the film thickness Tins (e.g. 30 nm) of the BST film 46 from the space d (e.g. 0.13 $\mu$m) between the lower electrodes 45. In other words, the film thickness T1 of the ruthenium film 47 satisfies the relation T1>(d−2×Tins)/2. When the ruthenium film 47 is formed to at least such a film thickness, the ruthenium film 47 can bury the holes 43, and it becomes possible to form the second layer, that is to be explained next, by sputtering.

Incidentally, a thin ruthenium film may be formed by sputtering prior to deposition of the ruthenium film 47 by CVD. In this case, the ruthenium film formed by sputtering functions as the seed film in CVD. Consequently, the formation of the ruthenium film 47 becomes easier, and the burying property can be improved.

Figure 9:
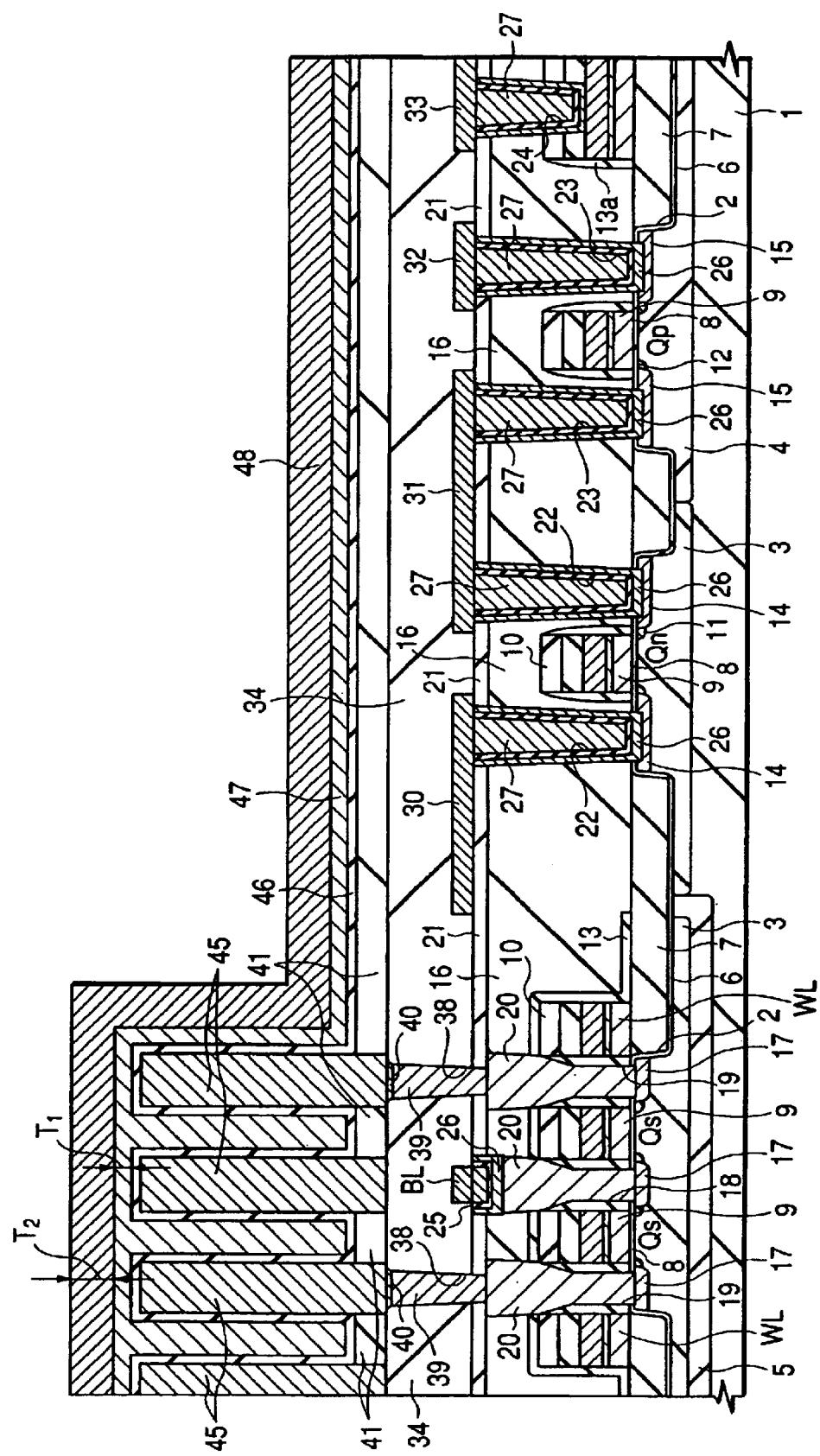

Next, as shown in FIG. 9, a tungsten film 48 as the second layer is formed. The tungsten film 48 constitutes the upper electrode 49 of the DRAM capacitor in cooperation with the ruthenium film 47 (first layer) described above, as will be explained later.

Sputtering is used to form the tungsten film 48. As described above, the ruthenium film 47 buries the recesses between:tlye lower electrodes 45 and its surface is substantially flat. Therefore, CVD providing excellent step coverage or a high burying property need not be employed. When the CVD Process is employed to deposit the tungsten film, the CVD atmosphere contains hydrogen and therefore becomes a reducing atmosphere. Since this embodiment uses the BST film 46 as described above, there is the possibility that hydrogen permeates through the ruthenium film 47 and reaches the BST film 46. The BST film 46 contains oxygen, and if hydrogen reaches the BST film 46, hydrogen would extract oxygen in the film, thereby increasing the oxygen defects. Consequently, this embodiment does not employ CVD which generates a reducing atmosphere after the formation of the BST film 46 after recovery of the oxygen defects, but uses sputtering. Therefore, this embodiment provides a great effect for improving the performance of the BST film 46 (such as reduction of the leakage current).

The film thickness T2 of the tungsten film 48 is greater than the film thickness T1 of the ruthenium film 47. When T2>T1, the overall stress of the upper electrode 49 can be reduced. In other words, the platinum group elements such as ruthenium generally have a large internal stress. When only a platinum group element is used to constitute the upper electrode 49, a considerable film thickness is necessary for reducing the resistance to a necessary resistance value on the basis of this assumption, the overall stress of the upper electrode 49 becomes great. In contrast, tungsten does not create a large stress unlike the platinum group elements. The drop of capacitor performance, particularly the increase of the leakage current due to the stress to the BST film, occurs under a large stress state. However, this embodiment divides and forms the upper electrode 49 into a lower layer (ruthenium film 47) and an upper layer (tungsten film 48). Therefore, this embodiment can limit the overall stress of the upper electrode 49 to a low level while securing the necessary film thickness (the overall film thickness of the upper electrode 49). Consequently, this embodiment can maintain a good capacitor performance (leakage current characteristics).

As the tungsten film 48 is formed, the resistance value of the upper electrode 49 can be kept at a low value. In other words, ruthenium has a resistivity of 50 $\mu\Omega$cm, whereas tungsten has a resistivity as low as 10 $\mu\Omega$cm. Therefore, even when the film thickness is the same, this embodiment can reduce the overall resistance value of the upper electrode 49 much more than when only the ruthenium film 47 is used to constitute the upper electrode 49. Moreover, because the tungsten film 48 can be formed to a large film thickness as described above, the resistance of the upper electrode 49 can be further reduced. When the film thickness of the ruthenium film 47 is 50 nm and the film thickness of the tungsten film is 100 nm, for example, the sheet resistance is 1 $\Omega$/square. When only the ruthenium film having a film thickness of 50 nm is used to constitute the lower electrode, the sheet resistance is 10 $\Omega$/square. Thus, the resistance value of the upper electrode 49 can be drastically reduced.

The tungsten film 48 does not substantially contain oxygen. Therefore, even when the plug is formed as will be explained later, an oxide film of the metal (such as titanium) in the plug (comprising a laminate film of titanium nitride and tungsten, for example) is not formed on the interface. Such an oxide (titanium oxide) is a non-conductor or a material having high electric resistance. When it is formed between the plug and the tungsten film 48 (upper electrode 49), the oxide becomes a factor that inhibits electric connection or is a cause of a conduction defect. However, this embodiment does not form such an oxide (conduction inhibiting material). As a result, the plug and the capacitor can be connected reliably, the connection reliability can be improved, and the reliability and performance of the DRAM can be kept at a high level. Incidentally, this explanation assumes that the tungsten film 48 does not substantially contain oxygen. However, the present invention does not exclude the case where oxygen is contained to such an extent as not to form the conduction inhibiting material. In other words, the present invention permits the mixture of oxygen content if the amount is extremely small or if conduction can be secured by tunneling or if the film of the conduction inhibiting material is so thin that it can easily undergo dielectric breakdown even when the conduction inhibiting material is formed. For example, it is oxygen in the atmospheric air or the steam that adheres to the surface of the tungsten film 48 at the stage before the formation of the plug, for example. It is also oxygen that is unavoidably mixed at the time of the formation of the tungsten film 48 (sputtering).

Besides the features described above, the tungsten film 48 has the features that it has a lower etching rate than the ruthenium film 47 as the first layer under the etching condition of the silicon oxide film, that its evaporation rate is lower in the oxidizing atmosphere, and so forth. These points will be explained in further detail in the subsequent process steps.

Figure 10:
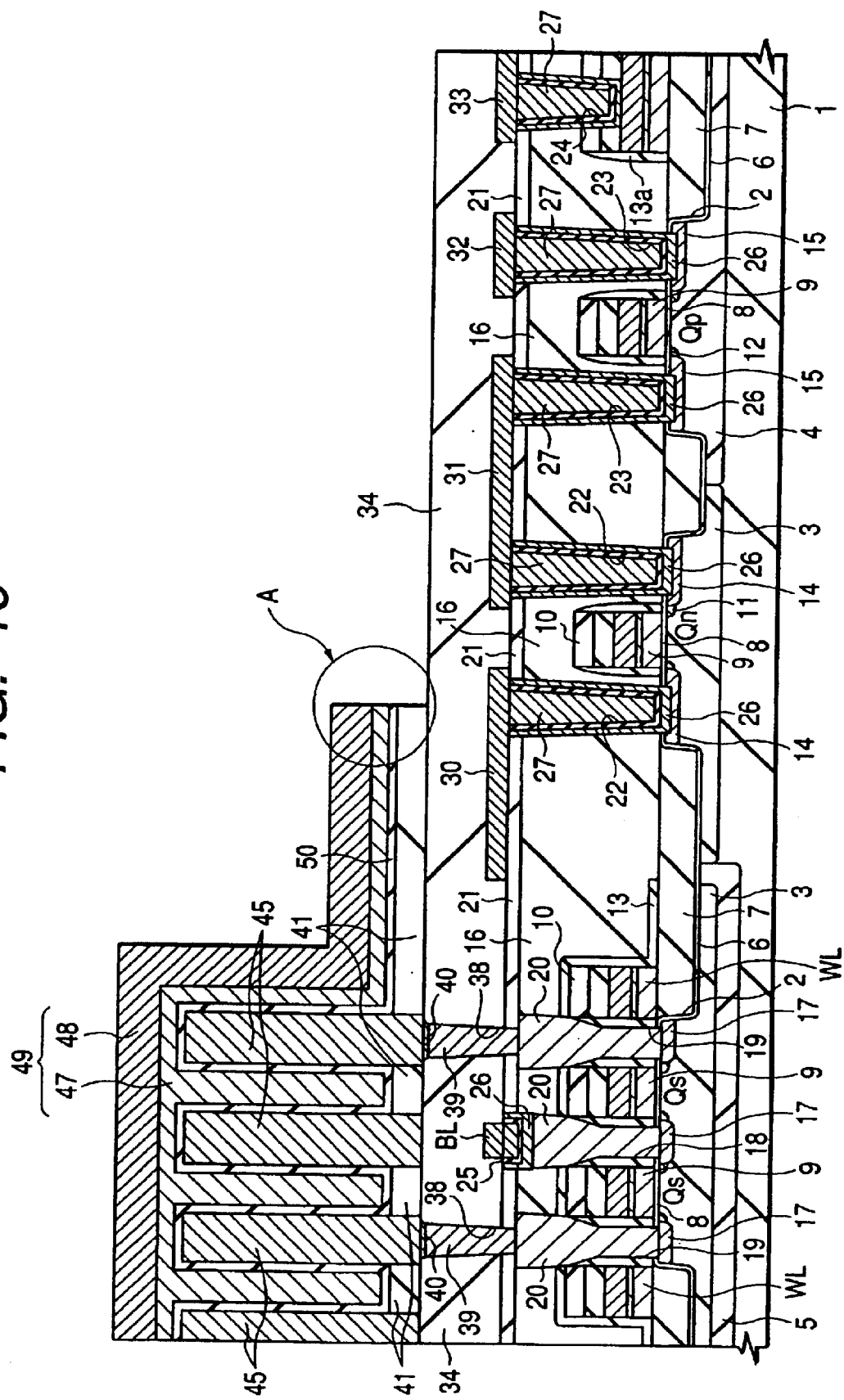

Next, as shown in FIG. 10, a photoresist film not shown in the drawing is formed over the tungsten film 48, and the tungsten film 48, the ruthenium film 47 and the BST film 46 are etched using the photoresist film as the mask. In this way, the upper electrode 49 comprising the tungsten film 48 (second layer) and the ruthenium film 47 (first layer) and the capacitor insulating film 50 comprising only the BST film 46 are formed. At the same time, the silicon nitride film 41 is etched away. In this way, the silicon nitride film 41 of the peripheral circuit portion is removed, and etching becomes easy when the through-holes are formed subsequently in the peripheral circuit portion.

In the etching process described above, it is possible to etch the tungsten film 48 using the photoresist film as a mask, and then to remove the photoresist film, and to etch further the ruthenium film 47 and other films using the tungsten film 48 as a mask. In this case, the tungsten film 48 is allowed to function as a hard mask, and so the etching accuracy can be improved.

Figure 11A:
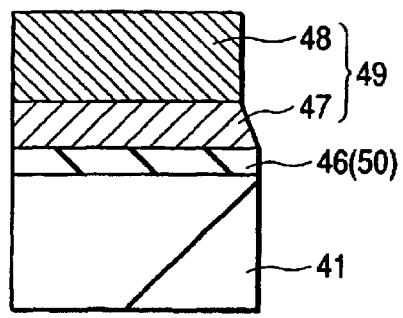
FIGS. 11(a) and 11(b) are enlarged sectional views of an example of a portion A in FIG. 10.
Figure 11B:
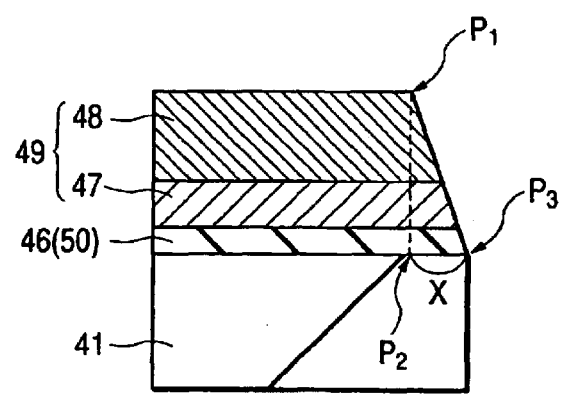

When the etching described above is anisotropic etching or etching of the type that processes the etching section into a substantially vertical section, the etching section shown in FIG. 11(*a*) is formed. FIGS. 11(*a*) and 11(*b*) are enlarged sectional views of the portion A in FIG. 10. In other words, the tungsten film 48 and other films are processed into a substantially vertical section, but a taper is formed on the etching section of the ruthenium film 47. The etching of the ruthenium film 47 is more difficult than tungsten, and the like, and vertical etching is more difficult. In such a case, reaction products having low volatility (such as $RuO_2$) are formed sometimes on the sidewall of the ruthenium film 47. Such reaction products might become dust after they are peeled off in the subsequent cleansing step. Therefore, etching can be conducted under the condition where the tungsten film 48, the ruthenium film 47 and the BST film 46 are etched slantingly as shown in FIG. 11(*b*). In this way, it becomes possible to prevent the formation of the reaction products (side film) on the sidewall of the ruthenium film 47 . . . and the occurrence of the dust and to improve the yield of the semiconductor integrated circuit device and its reliability. The angle of slant etching may be such that the distance X from the end (leg) P2 of the vertical from the upper end P1 of the taper surface to the surface of the base, to the lower end P3 of the of the taper surface is a value (e.g. 65 nm) greater than ½ of the minimum processing size (e.g. 0.13 $\mu$m).

Figure 12:
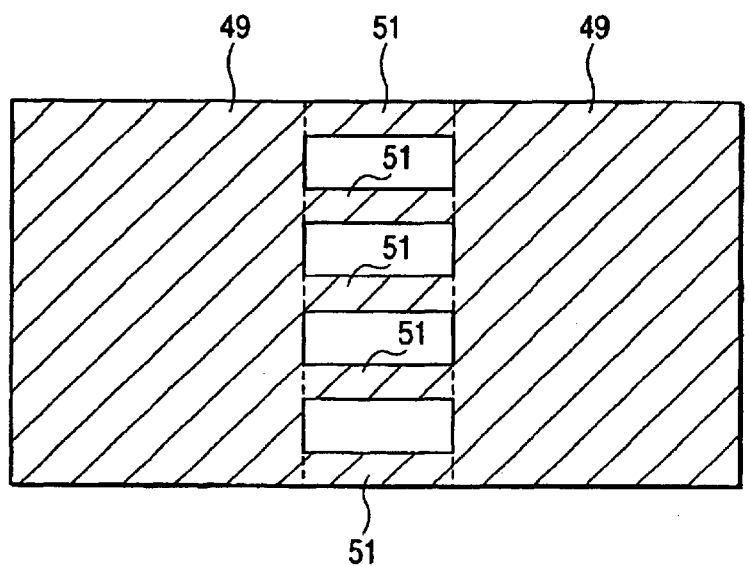

As shown in FIG. 12, patterning of local wires 51 can be conducted simultaneously with patterning of the upper electrodes 49. In other words, the upper electrode 49 is formed for each memory mat, and the local wire 51 can be formed as the wire that connects the adjacent memory mats. The local wire 51 comprises the ruthenium film 47 and the tungsten film 48 in the same way as the upper electrode 49. Since the tungsten film 48 is disposed in this embodiment, the resistance of the local wire 51 can be reduced. Since the local wire 51 is formed as the wire for connecting the upper electrode 49 of each memory mat, it is not necessary to pull up the wire to the upper layer through the through-hole and to connect the upper electrodes 49 through the second layer wire. Therefore, the area for forming the through-holes is not necessary, a high integration density can be achieved, and design can be made easily. Incidentally, though this embodiment represents the wire for connecting the upper electrodes 49, the wire may be used as the local wire of the peripheral circuit region, too.

Figure 13:
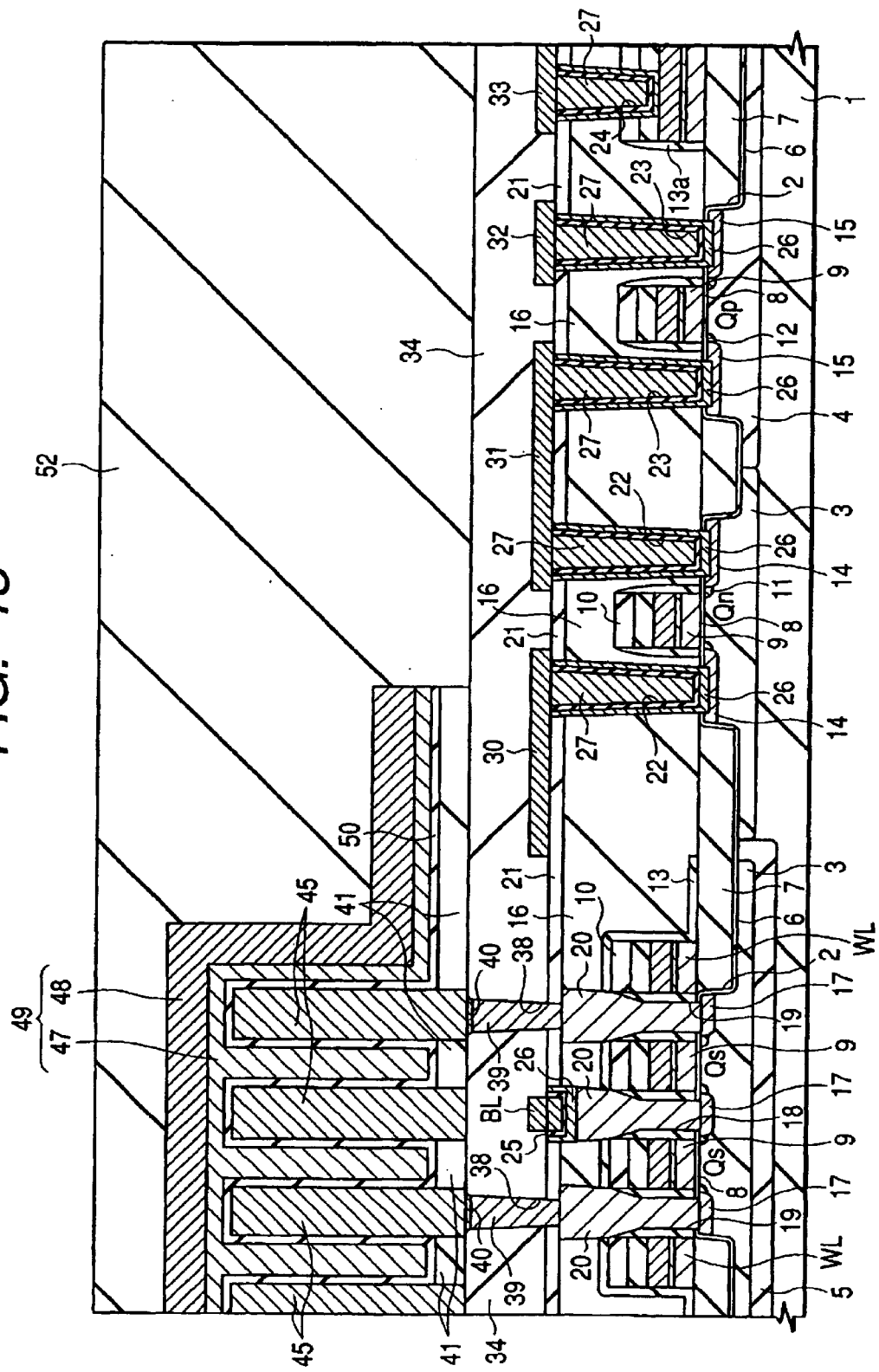

Next, as shown in FIG. 13, a silicon oxide film 52 is so formed as to cover the upper electrodes 49. The silicon oxide film 52 can be formed through deposition of a TEOS oxide film and planarization of its surface by CMP.

Figure 14:
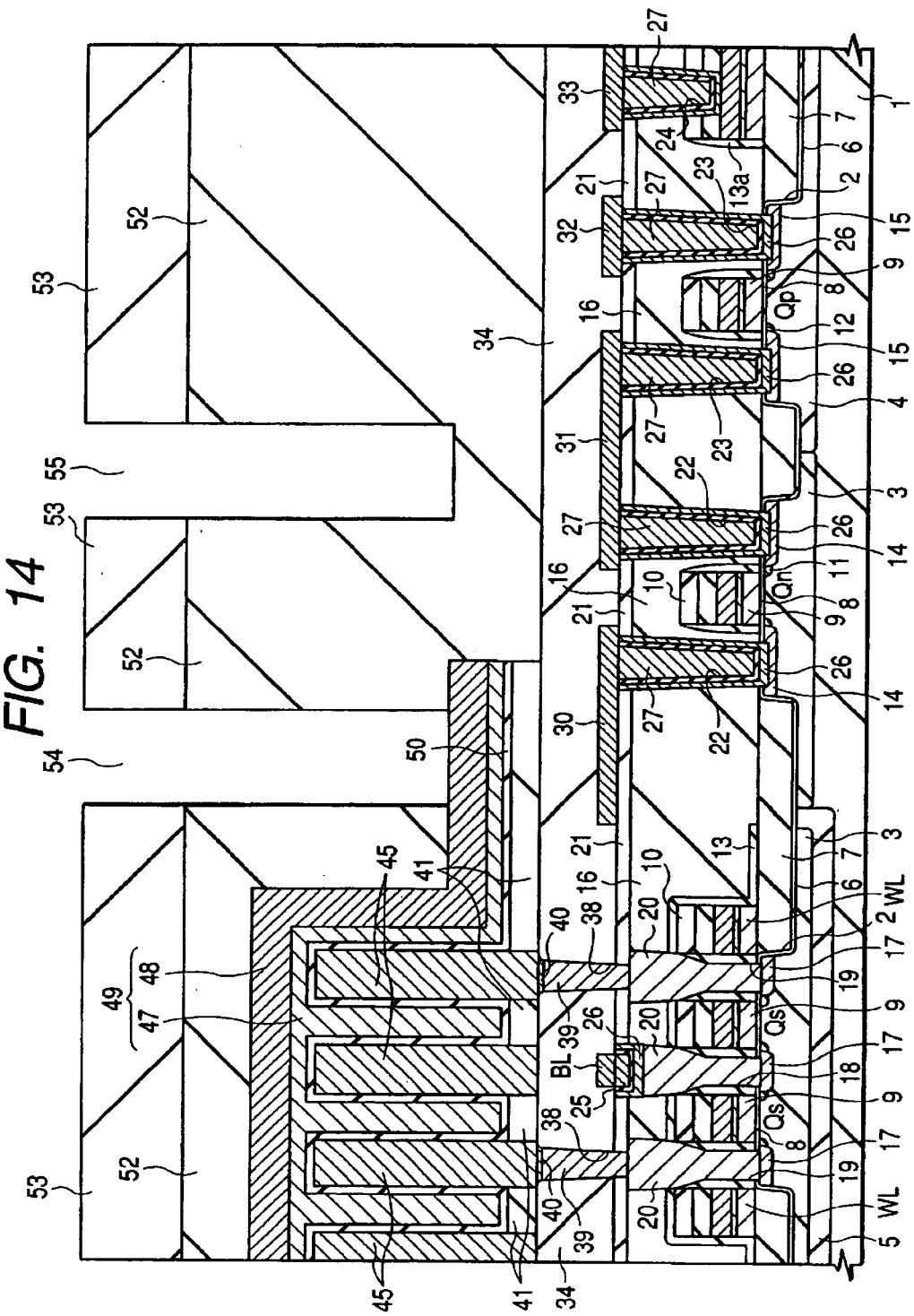

A photoresist film 53 is then formed on the silicon oxide film 52 as shown in FIG. 14. The photoresist film 53 is formed in such a fashion as to open to the regions where the plug for connecting the second layer wire and the upper electrode 49 and the plug for connecting the second layer wire and the first layer wire are formed. Here, the opening corresponding to the plug for connecting the second layer wire and the upper electrode 49 is represented by reference numeral 54, and the opening corresponding to the plug for connecting the second layer wire and the first layer wire 31 is represented by reference numeral 55. When etching of the silicon oxide film 52 is performed by using the photoresist film 53 having these openings 54 and 55 as a mask, a state occurs in which the etching hole of the opening 54 reaches the surface of the upper electrode 49 (surface of tungsten film 48) during the etching process, but the etching hole of the opening 55 does not yet reach the surface of the first layer wire 31. Since the opening step of the through-hole is not yet finished at this point of time, the opening 54 undergoes over-etching. In this instance, the tungsten film 48 functions as an etching stopper. In other words, the tungsten film 48 using as the second layer is made of a material having a lower etching rate than the ruthenium film 47 serving the first layer under the condition where the silicon oxide film is etched. In the construction of the upper electrode 49 in which the tungsten film 48 is not formed, ruthenium starts being etched at the point at which the etching hole reaches the ruthenium film during etching. Since ruthenium is not resistant to etching in the etching atmosphere of the silicon oxide film, the through-hole is formed while penetrating through the ruthenium film. In contrast, because the tungsten film 48 is formed in this embodiment, the through-hole is not formed while penetrating through the upper electrode 49. As a result, a sufficient contact area can be secured with the plug that is to be later formed, and the connection reliability between the upper electrode 49 and the plug can be improved.

Figure 15:
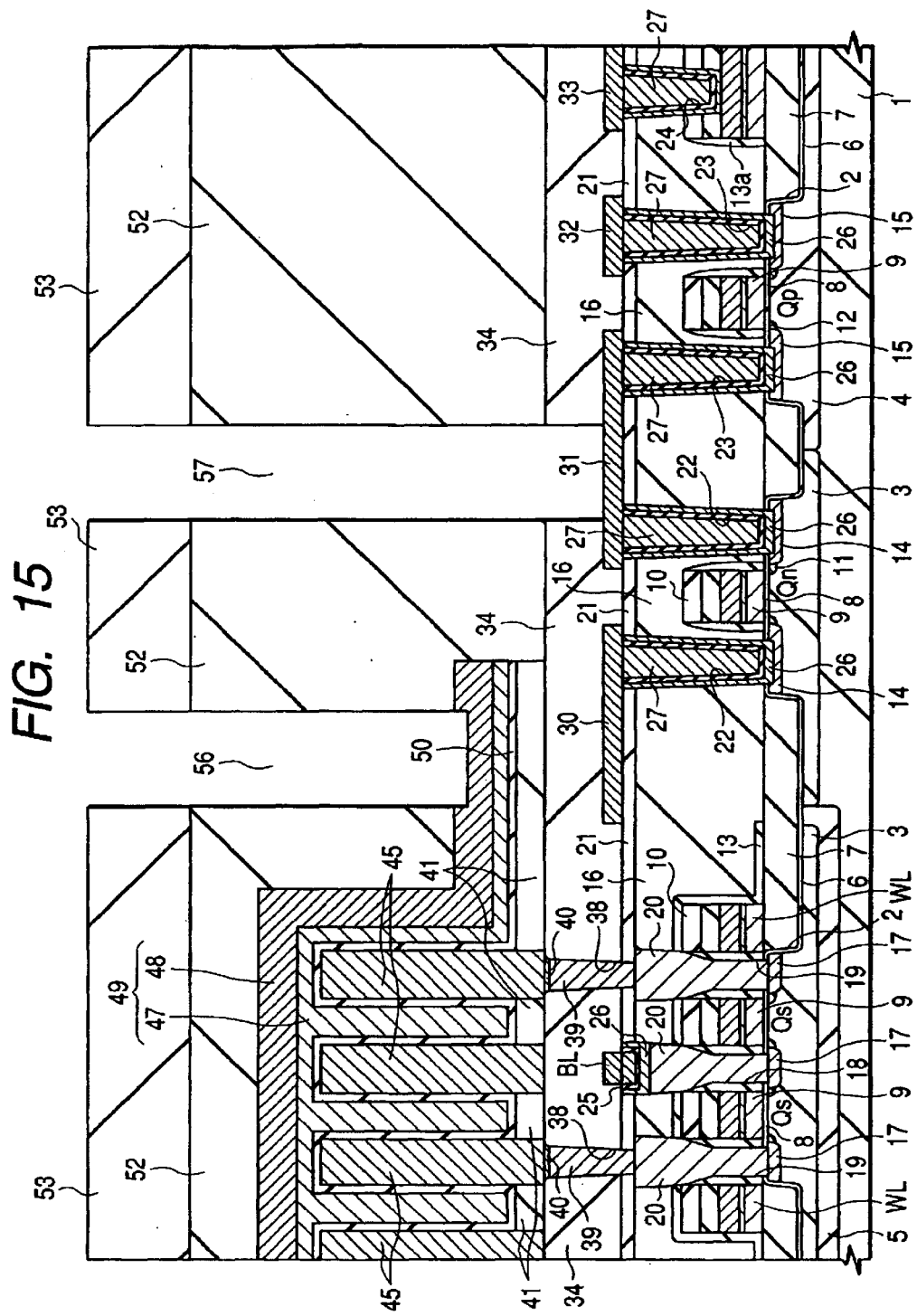

Etching is continued further, and the through-holes 56 and 57 are completed as shown in FIG. 15.

Figure 16:
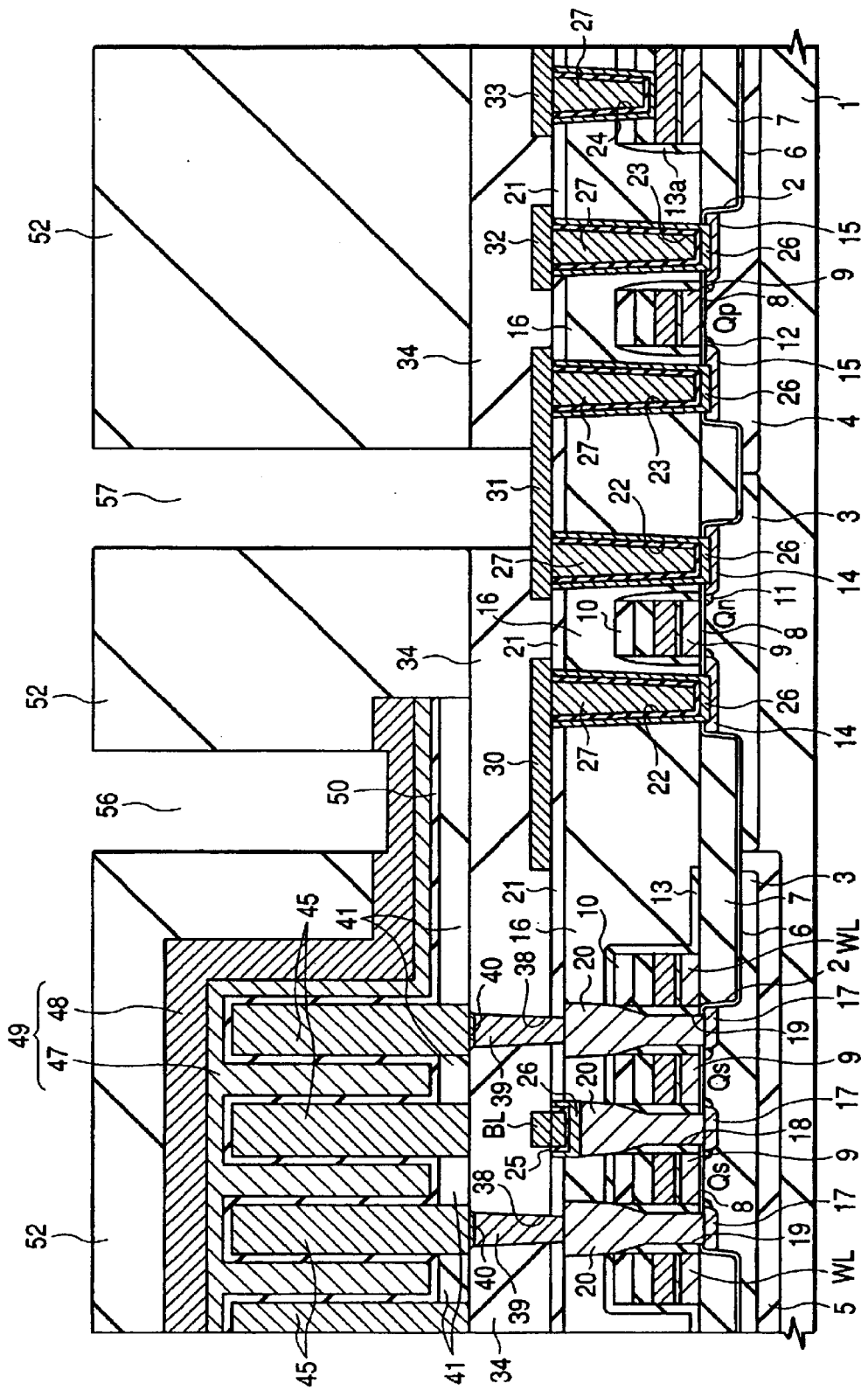

Next, the photoresist film 53 is removed as shown in FIG. 16. Removal of the photoresist film 53 is executed by a treatment (ashing) inside a plasma atmosphere of oxygen, or the like. In this ashing process, the bottom portion of the through-holes 56 and 57 is exposed to the oxidizing atmosphere, too. However, the tungsten film 48 is formed in this embodiment and functions as an oxidation prevention film. Therefore, the ruthenium film 47 does not evaporate. In other words, the platinum group material such as ruthenium evaporates due to the oxidizing atmosphere. If the through-hole 56 is so formed as to penetrate through the upper electrode 49, its end face moves back due to evaporation. In the prior art technology where the upper electrode 49 comprises only the ruthenium film, such regression of ruthenium invites a connection defect between the upper electrode and the plug. However, such a defect does not occur in this embodiment.

In the prior art technologies, the ruthenium film is exposed at the bottom of the through-hole 56. Therefore, the ruthenium film sucks oxygen during the treatment in the ashing atmosphere. This oxygen creates a metal oxide (such as titanium oxide) with the plug and deteriorates the connection reliability between the plug and the upper electrode, as described already. In this embodiment, however, the tungsten film 48 is formed and prevents the ruthenium film 47 from being exposed at the bottom of the through-hole 56. Therefore, the ruthenium film does not suck oxygen from the ashing atmosphere. Furthermore, since the tungsten film 48 has sufficient oxidation resistance and since suction of oxygen does not occur, a material that invites connection defects, such as titanium oxide, is not formed between the plug and the upper electrode 49. Therefore, the connection reliability between the upper electrode 49 and the plug can be kept at a high level, and the performance and reliability of the semiconductor integrated circuit device can be improved.

Figure 17:
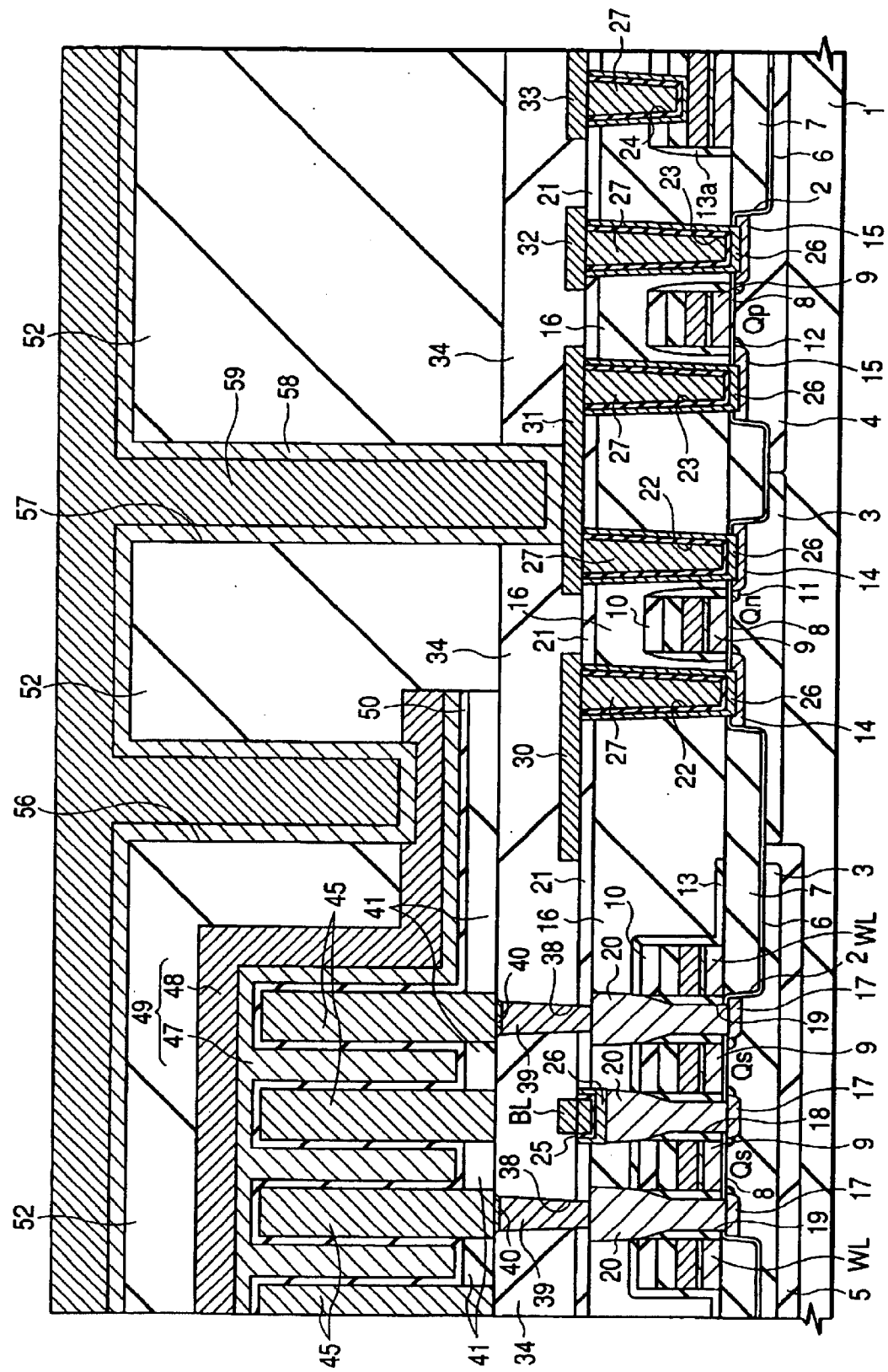

Next, as shown in FIG. 17, the titanium nitride film 58 serving as the barrier film and the tungsten film 59 are deposited to the silicon oxide film 52 inclusive of the inside of the through-holes 56 and 57. Deposition of the titanium nitride film 58 and the tungsten film 59 is made by CVD, for example. The titanium nitride film 58 is deposited in such a fashion as to extend along the inner wall of the through-holes 56 and 57, and the tungsten film 59 is so formed as to bury the through-holes 56 and 57.

Figure 18:
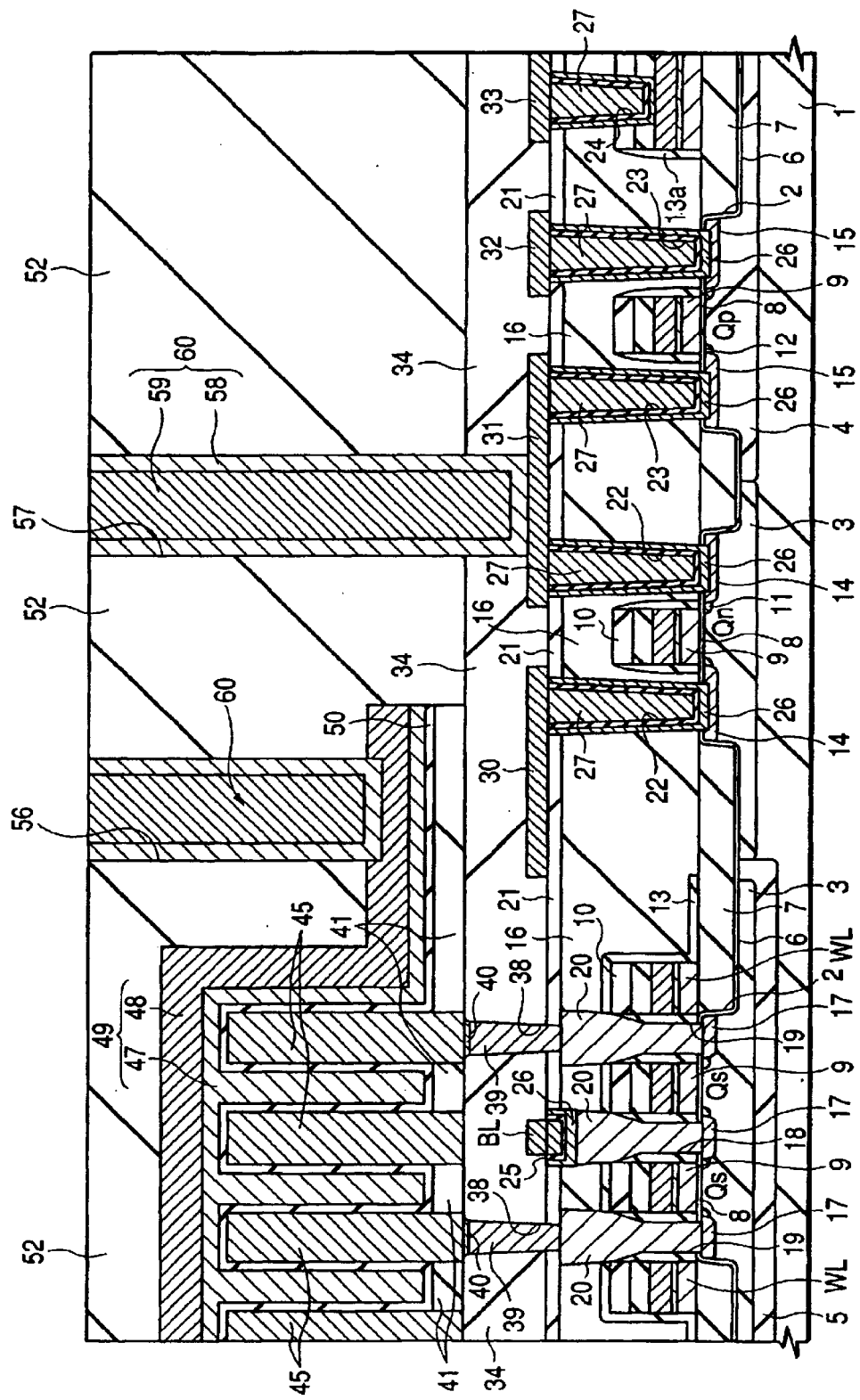

The titanium nitride film 58 and the tungsten film 59 on the silicon oxide film 52 are removed by etching-back or CMP, as shown in FIG. 18, thereby forming the plug 60. Titanium nitride is formed at the connection portion between the plug 60 and the upper electrode 49. However, since the tungsten film 48 does not substantially contain oxygen, a material that hinders electric connection (such as titanium oxide) is not formed on the interface with the plug 60.

Figure 19:
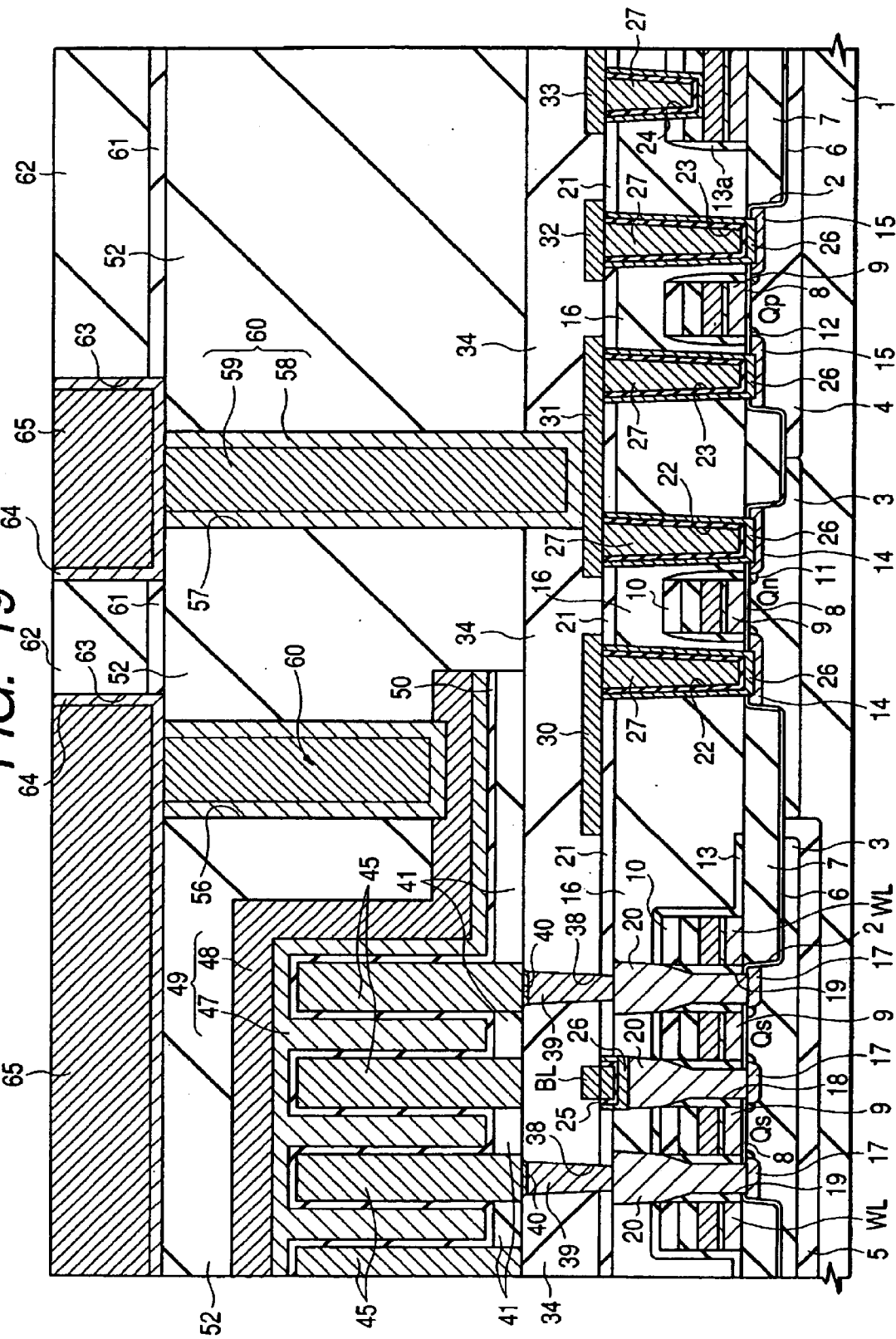

Next, as shown in FIG. 19, the second layer wire connected to the plug 60 is formed. The second layer wire is formed on the silicon nitride film 61 formed on the silicon oxide film 52 and in trenches 63 of the silicon oxide film 62 as the upper layer of the silicon nitride film 61. The trenches 63 are formed by etching conducted in two stages by using the photoresist film (not shown) formed on the silicon oxide film 62 as a mask. Etching of the first stage is conducted under the condition where the silicon oxide film is etched, but the silicon nitride film is not, thereby to etch the silicon oxide film 62. Etching of the second stage is conducted under the etching condition where the silicon nitride film is etched, thereby to etch the silicon nitride film 61. In consequence, excessive etching of the silicon oxide film 52 serving as the base can be prevented.

The second layer wire inside the trenches 63 is formed by first depositing the barrier film 64 such as tantalum, titanium nitride, etc, plating or sputtering a copper film 65, and polishing it by CMP in such a fashion as to leave the wire only inside the trenches 63.

Upper layer wires such as an inter-layer insulating film, a third layer wire, and so forth, can be subsequently formed, but their explanation will be omitted.

According to this embodiment, the upper electrode 49 comprises the ruthenium film 47 serving as the first layer and the tungsten film 48 serving as the second layer. Therefore, the connection reliability with the plug 60 can be improved, and the resistance of the upper electrode 49 can be reduced.

Second Embodiment

FIGS. 20 to 25 are sectional views each showing stepwise a method of production of a DRAM according to another embodiment of the present invention. Incidentally, the left-hand portion of each drawing, that shows the section of a substrate, represents a region in which memory cells of a DRAM are to be formed (memory cell array), and the right-hand portion represents a peripheral circuit region, in the same way as in the first embodiment.

The production method of this embodiment involves the same process steps as shown in FIG. 1 to FIG. 3 of the first embodiment, and its detailed explanation will be omitted.

Figure 20:
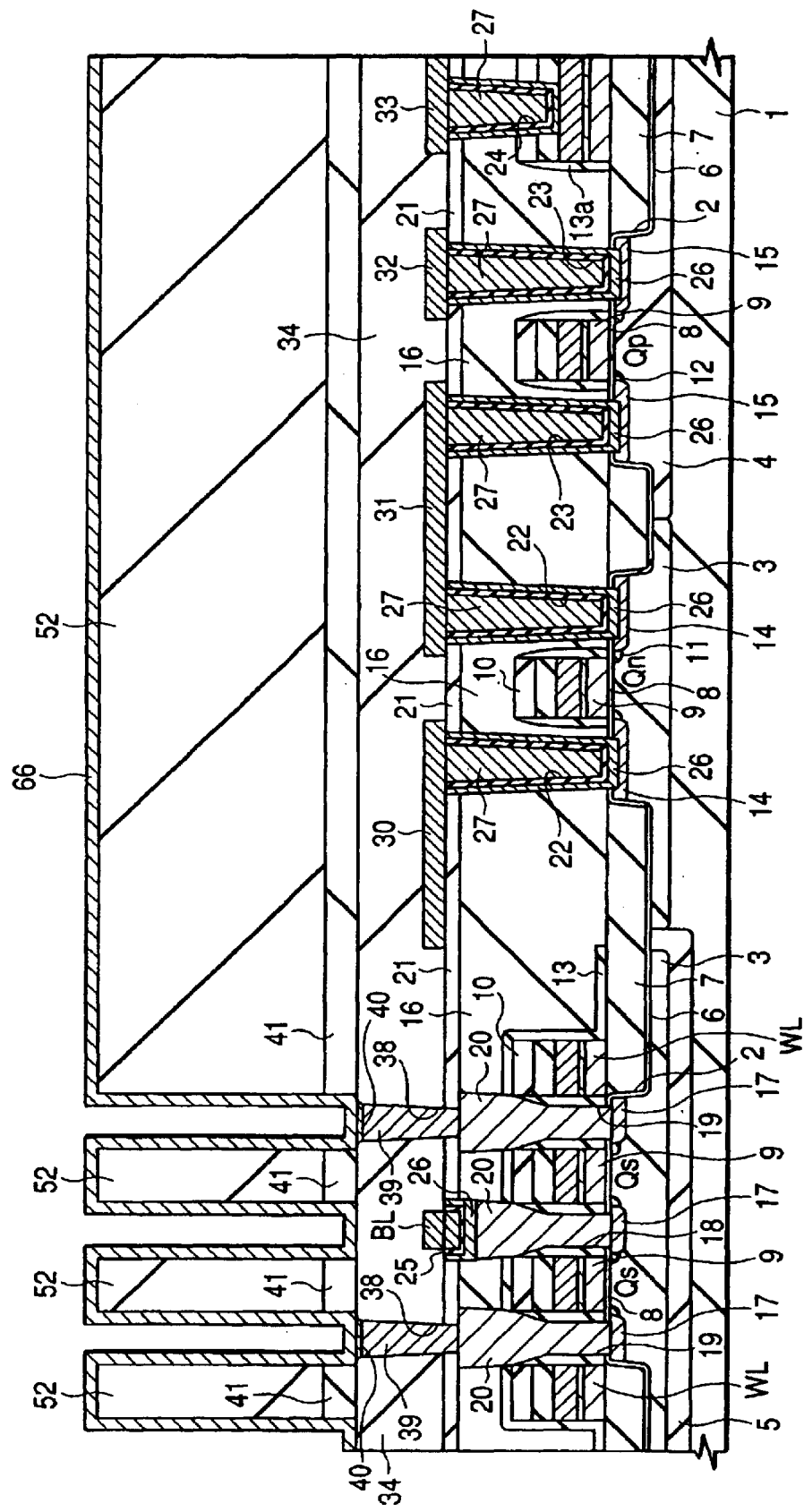
FIGS. 20 to 25 are sectional views each showing step-wise a method of production of a DRAM according to another embodiment (Embodiment 2) of the invention.

After the holes 43 are formed in the silicon oxide film 42 as shown in FIG. 3 of the first embodiment, a ruthenium film 66 is formed as shown in FIG. 20. Unlike the first embodiment wherein the ruthenium film 66 is so formed as to bury the holes 43, the ruthenium film 66 is formed in this embodiment in such a fashion as to extend along the inner wall of each hole 43 as shown in FIG. 20. The film thickness of the ruthenium film 66 is 50 nm, for example. To form the ruthenium film 66, either sputtering or CVD may be used. When CVD is employed, the ruthenium film 66 can be formed uniformly on the inner wall of each hole 43 processed finely in the same way as in the first embodiment.

Figure 21:
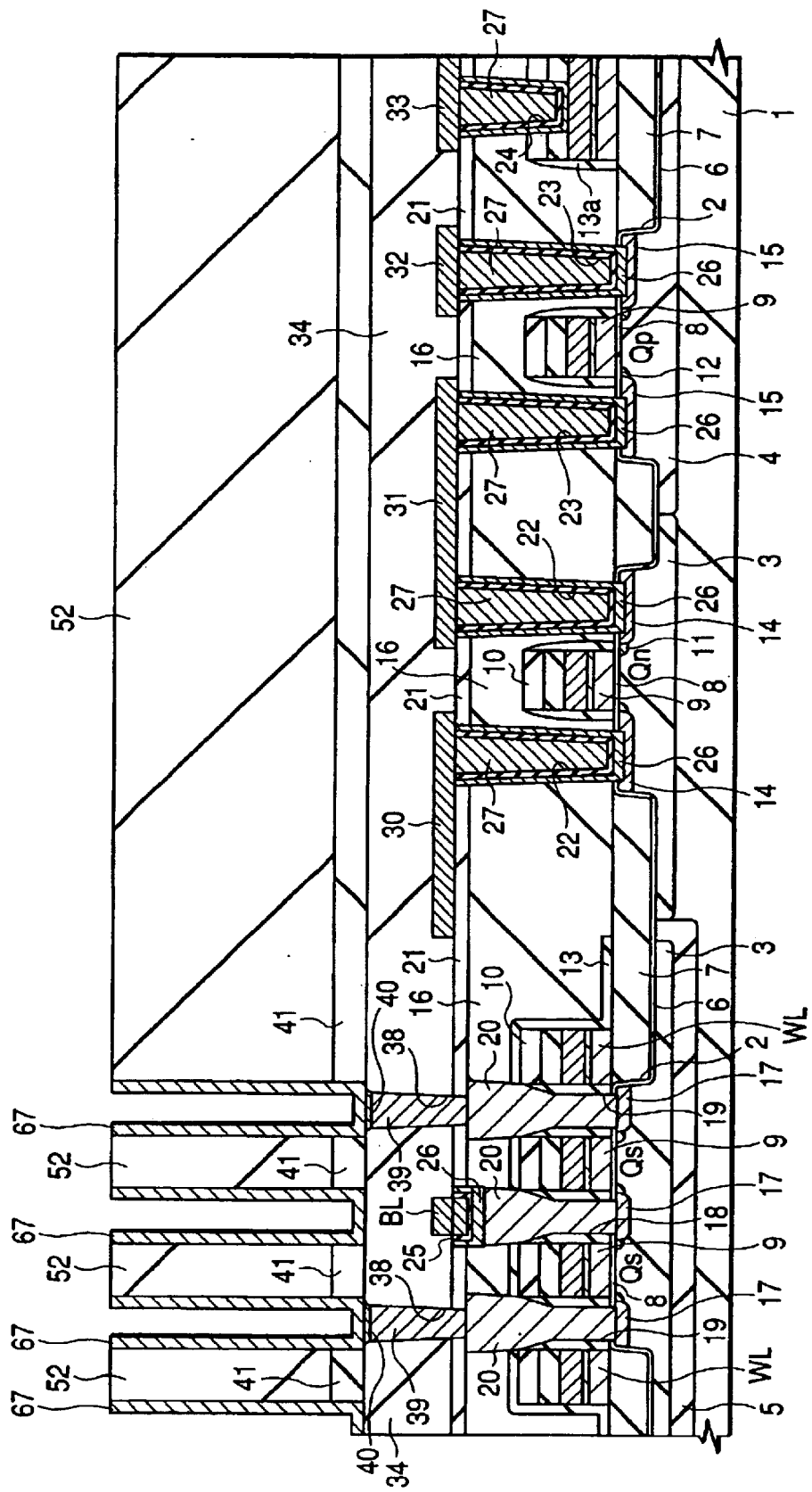

Next, as shown in FIG. 21, the ruthenium film 66 on the surface of the silicon oxide film 42 is removed in such a fashion as to leave the ruthenium film 66 on only the inner wall of the hole 43, and the lower electrode 67 is formed. To remove the ruthenium film 66 on the surface of the silicon oxide film 42, CMP or etching-back can be employed. In this removing step, a silicon oxide film for burying the holes 43 (with the proviso that an etching selection ratio can be secured with the silicon oxide film 42; SOG (Spin-On-Glass), for example) may be formed.

Unlike the first embodiment, the lower electrode 67 of this embodiment is formed into a cylindrical shape having an opening at its upper part. The surface that constitutes the capacitor is the cylindrical inner wall surface.

Figure 22:
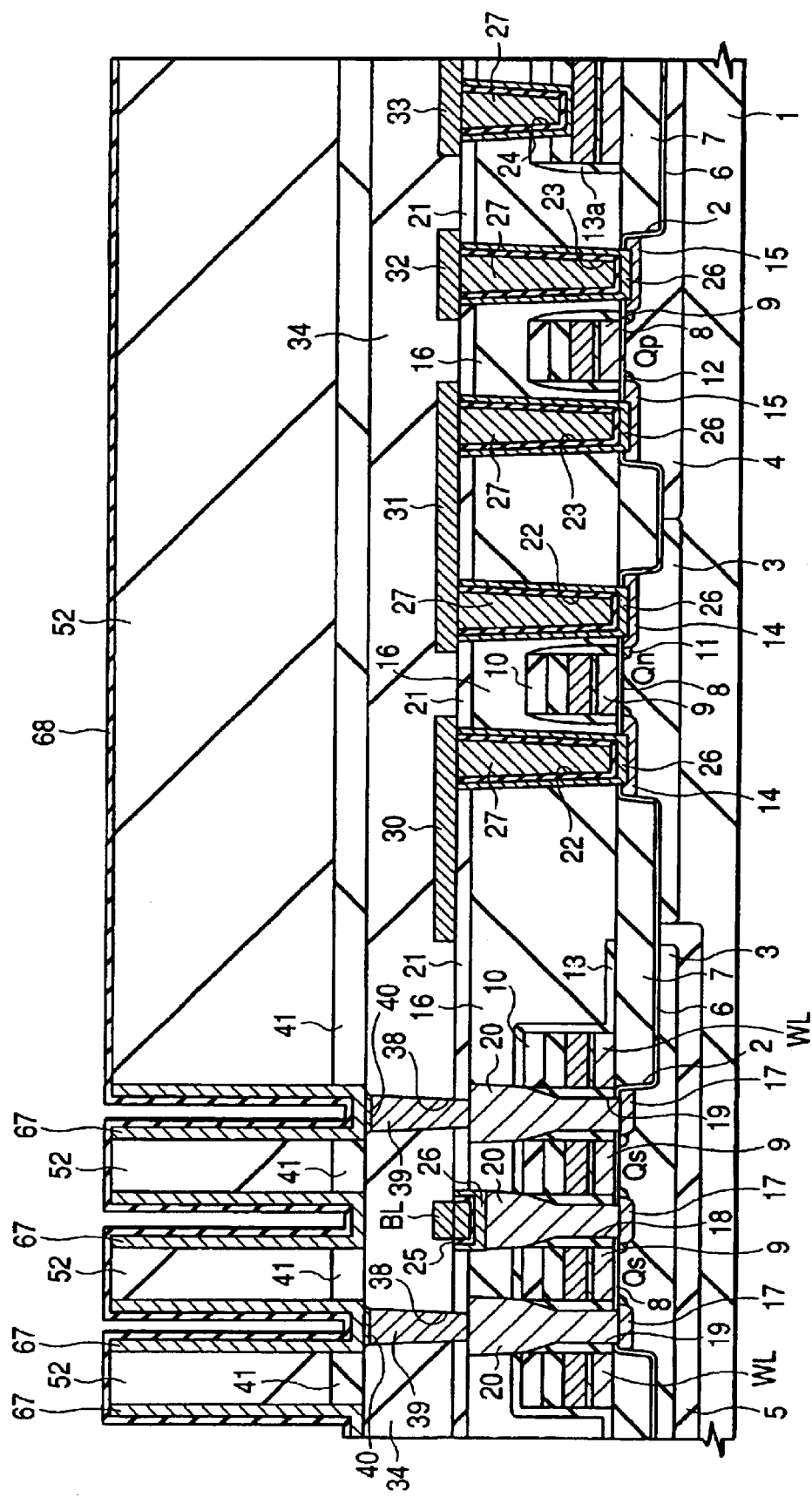

Next, the BST film 68 is so formed as to extend along the inner wall surface of the lower electrode 67 in the same way as in the first embodiment as shown in FIG. 22.

Figure 23:
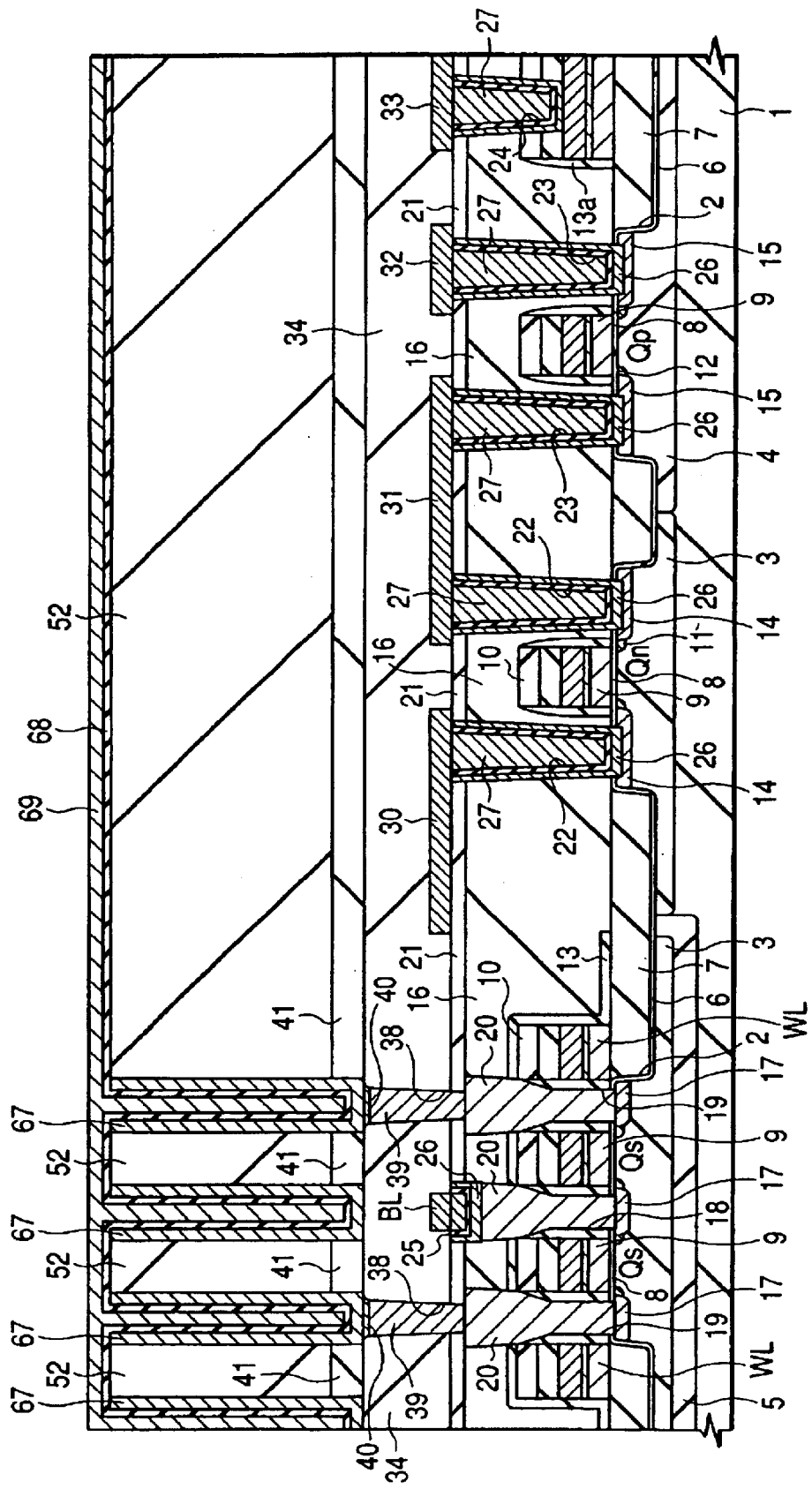

A ruthenium film 69 as the first layer is then formed on the BST film 68 as shown in FIG. 23. The ruthenium film 69 is formed in such a fashion as to bury the recess resulting from the hole 43. The recess is buried in the same way as in the first embodiment, but the film thickness of the ruthenium film 69 required for burying the recess is smaller in this embodiment than in the first embodiment. In other words, since the cylindrical lower electrode 67 is formed on the inner wall of the hole 43 in this embodiment, the film thickness of the ruthenium film 69 can be reduced by twice the film thickness of the lower electrode 67 (ruthenium film 66). In consequence, the occurrence of stress due to the ruthenium film 69 can be reduced, and the overall stress of the upper electrode that will be explained later can be reduced.

Figure 24:
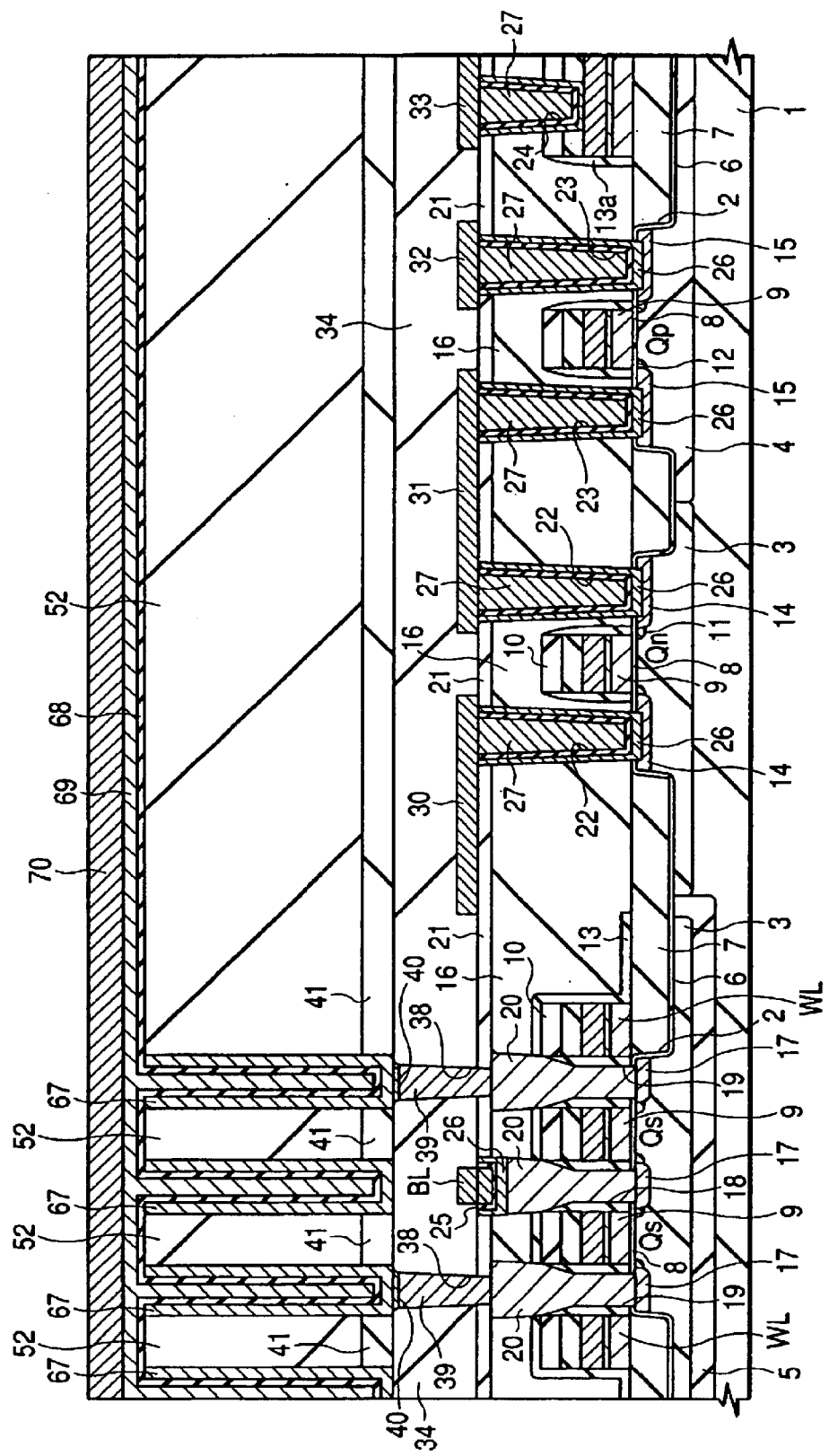

Next, as shown in FIG. 24, a tungsten film 70 is formed on the ruthenium film 69. The film thickness of the tungsten film 70 is greater than that of the ruthenium film 69 with the result that the resistance value of the upper electrode to be explained next can be reduced. Incidentally, since the internal stress of the tungsten film 70 is small, the overall stress of the upper electrode does not much increase even when the tungsten film 70 is formed to a large thickness.

Figure 25:
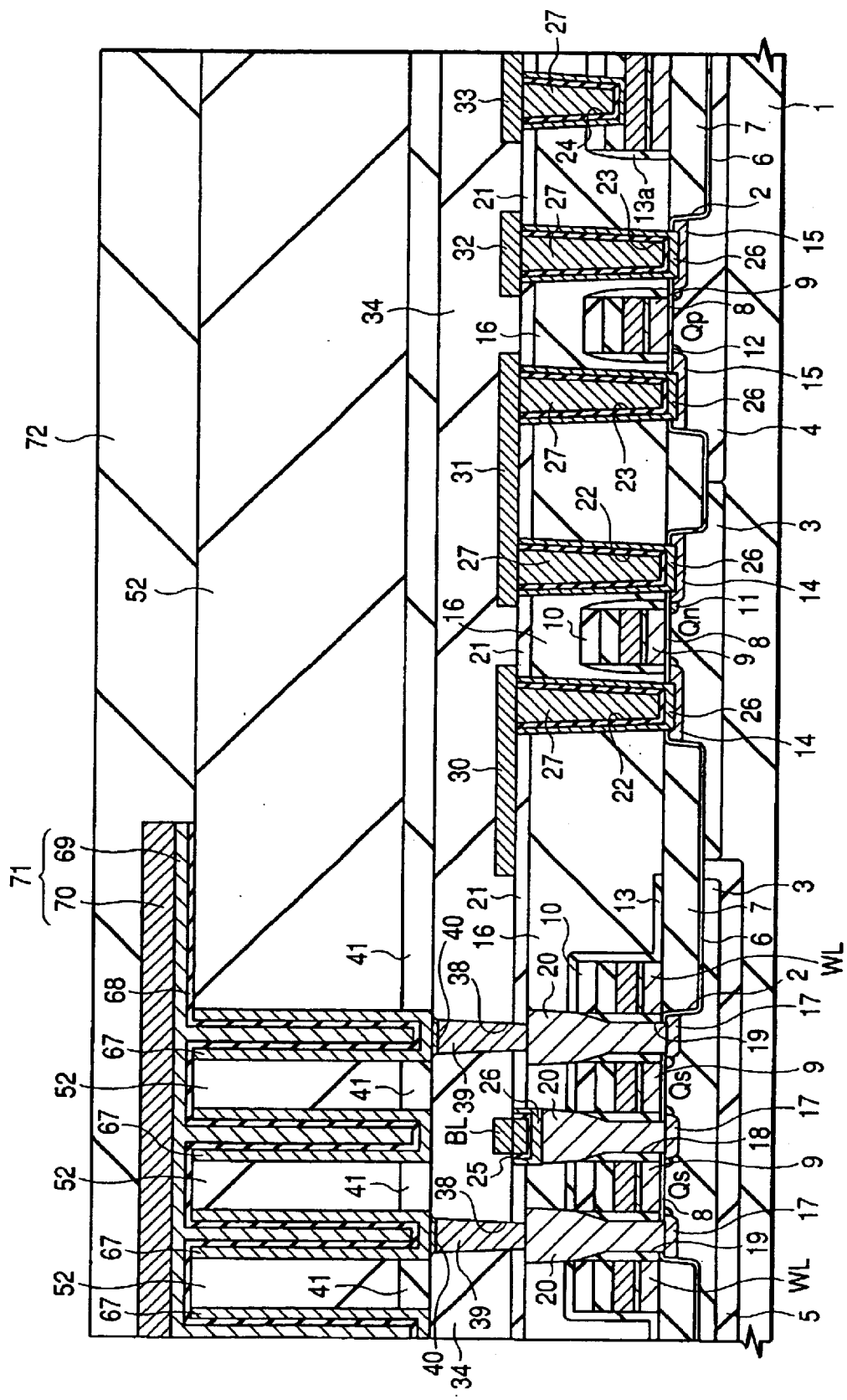

The tungsten film 70, the ruthenium film 69 and the BST film 68 are then etched by using the photoresist film as a mask as shown in FIG. 25. Incidentally, upper electrode 71 comprising the tungsten film 70 and the ruthenium film 69 is formed. In this embodiment, the film thickness of the tungsten film 70 is relatively great and the film thickness of the ruthenium film 69 is relatively small. Therefore, the contribution of the ruthenium film 69, the processing of which is difficult, is small, and the processing of the upper electrode 71 becomes easier.

An insulating film 72 is formed to cover the upper electrode 71. The insulating film 72 uses the TEOS oxide film, for example, and its surface is planarized by CMP, for example. Since the silicon oxide film 42.is left in the peripheral circuit region in this embodiment, the level difference of the insulating film 72 under the as deposited state, that is, before planarization by CMP, is small. For this reason, the load to the CPM process can be lowered.

Since the subsequent process steps are the same as those of the first embodiment, the explanation thereof will be omitted.

According to this embodiment, the cylindrical lower electrode 67 having the opening at its upper part can provide the same effect as that of the first embodiment.

Though the embodiments of the invention completed by the present inventor have thus been described, the invention is not particularly limited to these embodiments but can be naturally changed or modified in various ways without departing from the scope thereof.

Figure 26:
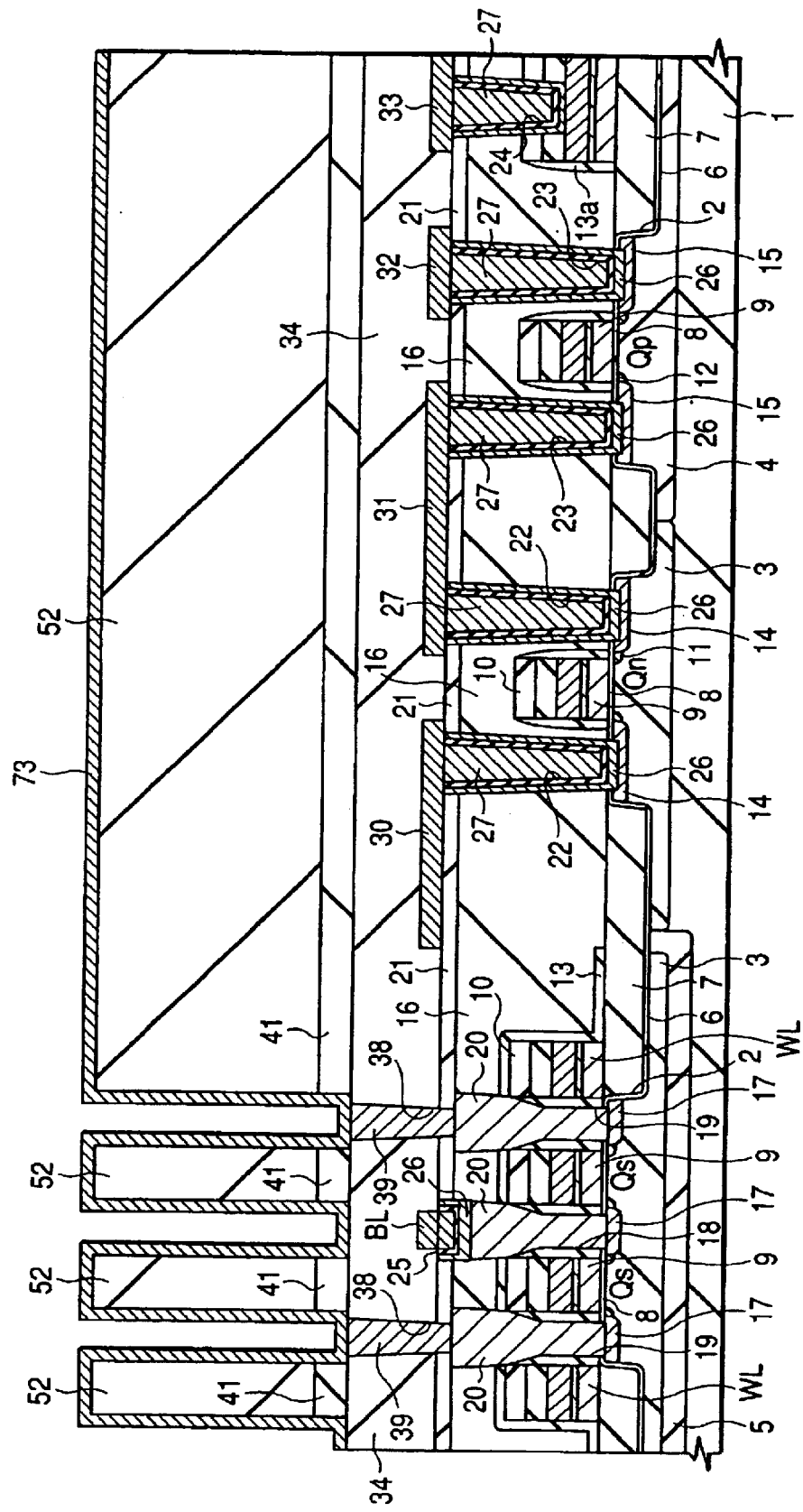
FIG. 26 is a sectional view showing step-wise another example of the method of production the DRAM according to Embodiments 1 and 2.
Figure 27:
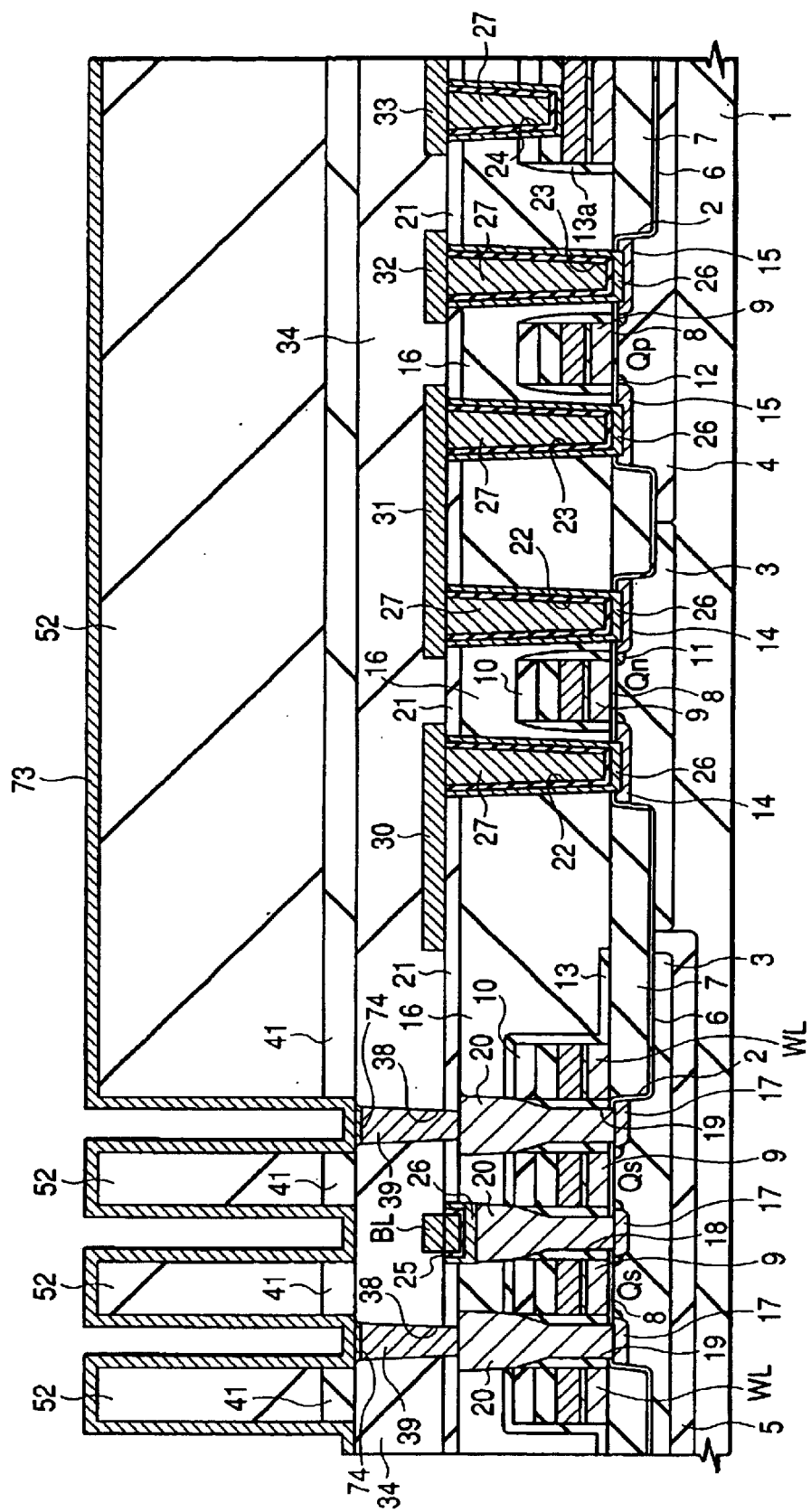
FIG. 27 is a sectional view showing step-wise still another example of the method of production the DRAM according to Embodiments 1 and 2.

The first and second embodiments represent the case where the barrier film 40 is formed on the plug 39 and the silicon nitride film 41 and the silicon oxide film 42 are then formed. As shown in FIGS. 26 and 27, however, ruthenium silicide may be formed as the barrier layer after the holes 43 are formed. In other words, after the holes 43 are formed in the silicon nitride film 41 and the silicon oxide film 42, sputtering, for example, is conducted to form the ruthenium film 73 as shown in FIG. 26. The film thickness is 50 nm, for example. Next, as shown in FIG. 27, the substrate 1 is heat-treated at about 600° C., for example. The plug 39 made of silicon and the ruthenium film 73 are thus allowed to react with each other to form ruthenium silicide 74. The ruthenium film 73 is then removed by dry etching, for example. The subsequent process steps are the same as those of the first or second embodiment.

Figure 28:
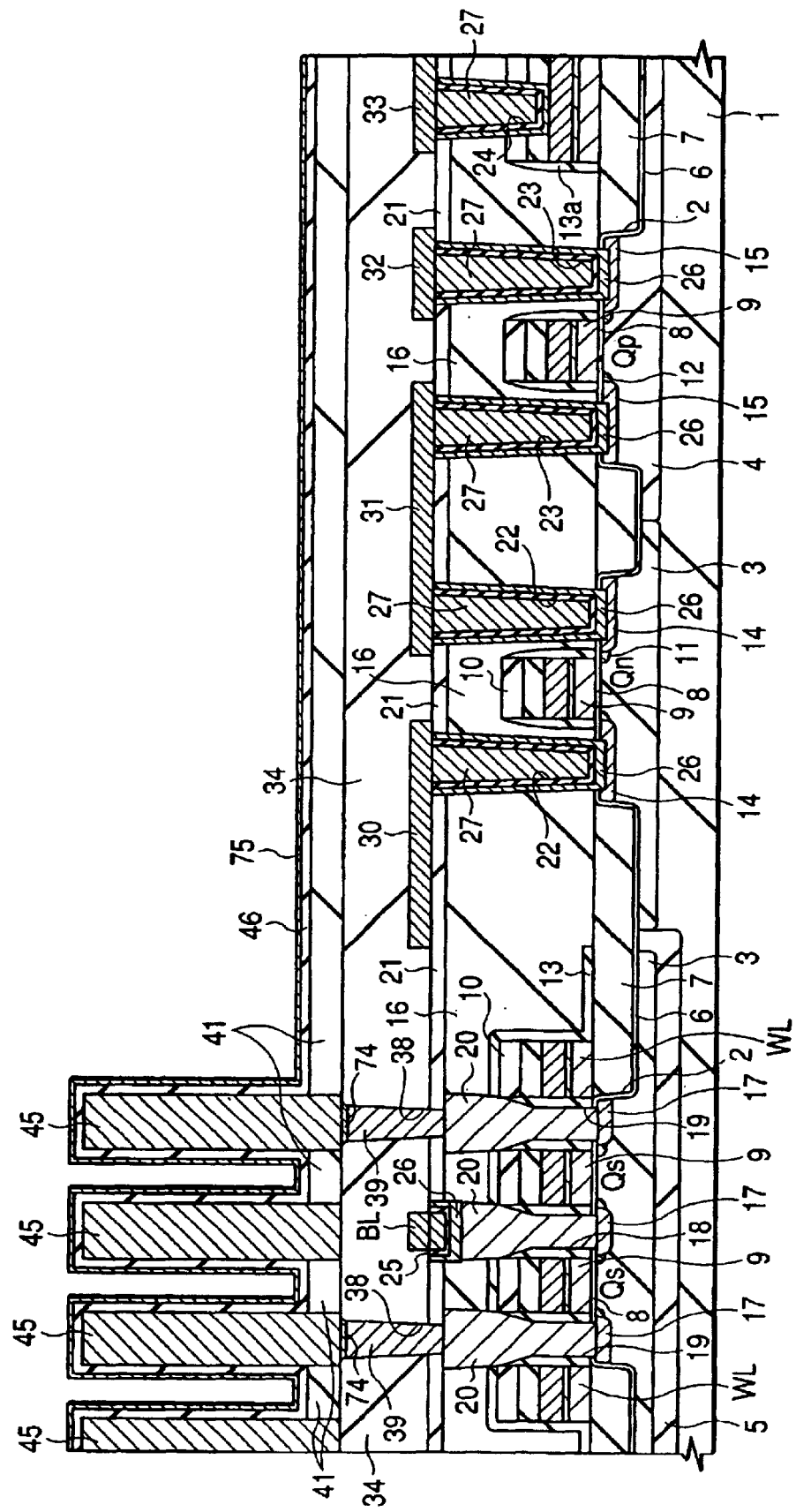
FIG. 28 is a sectional view showing step-wise still another example of the method of production of the DRAM according to Embodiment 1.
Figure 29:
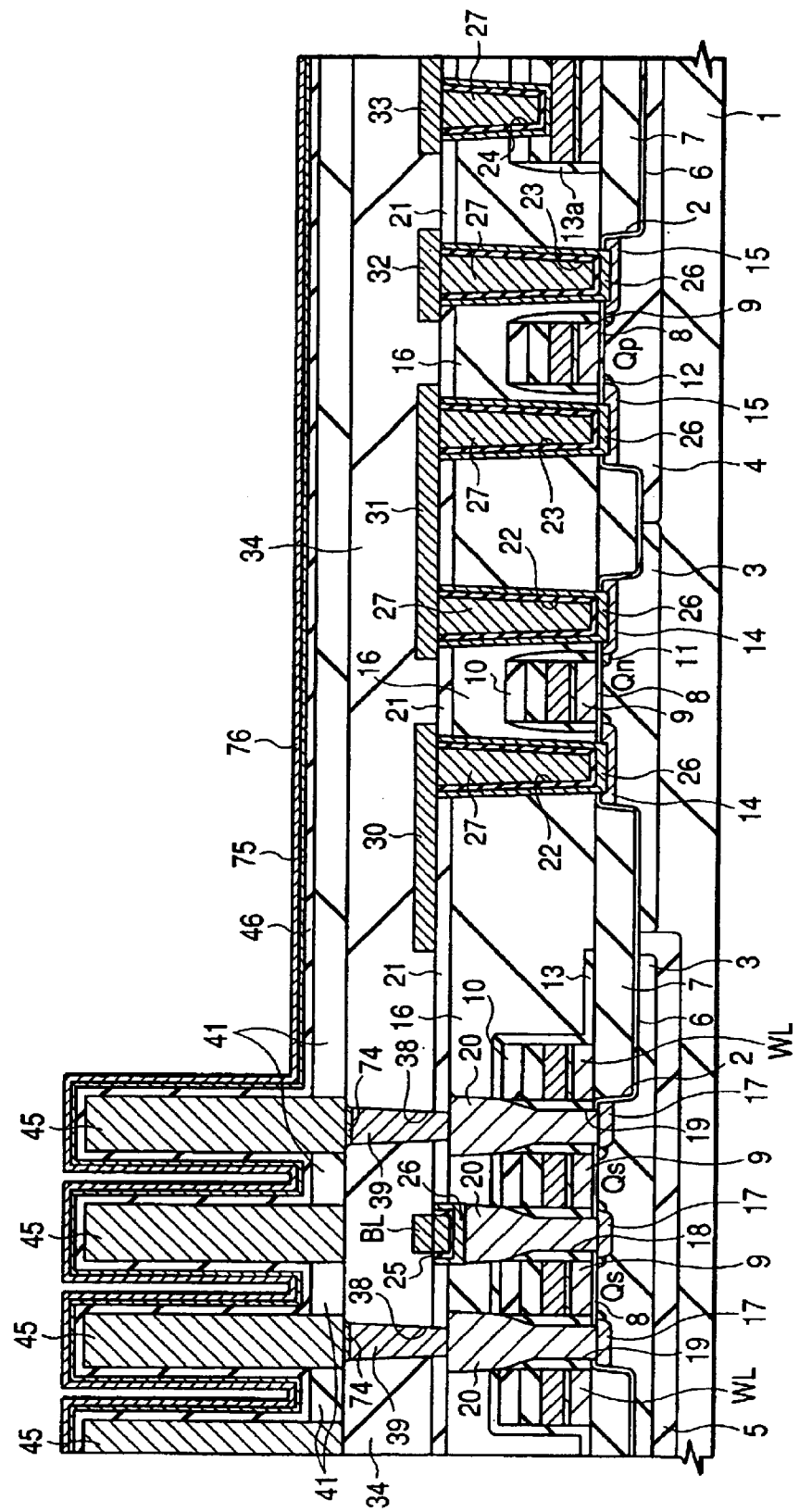
FIG. 29 is a sectional view showing step-wise still another example of the method of production of the DRAM according to Embodiment 1.
Figure 30:
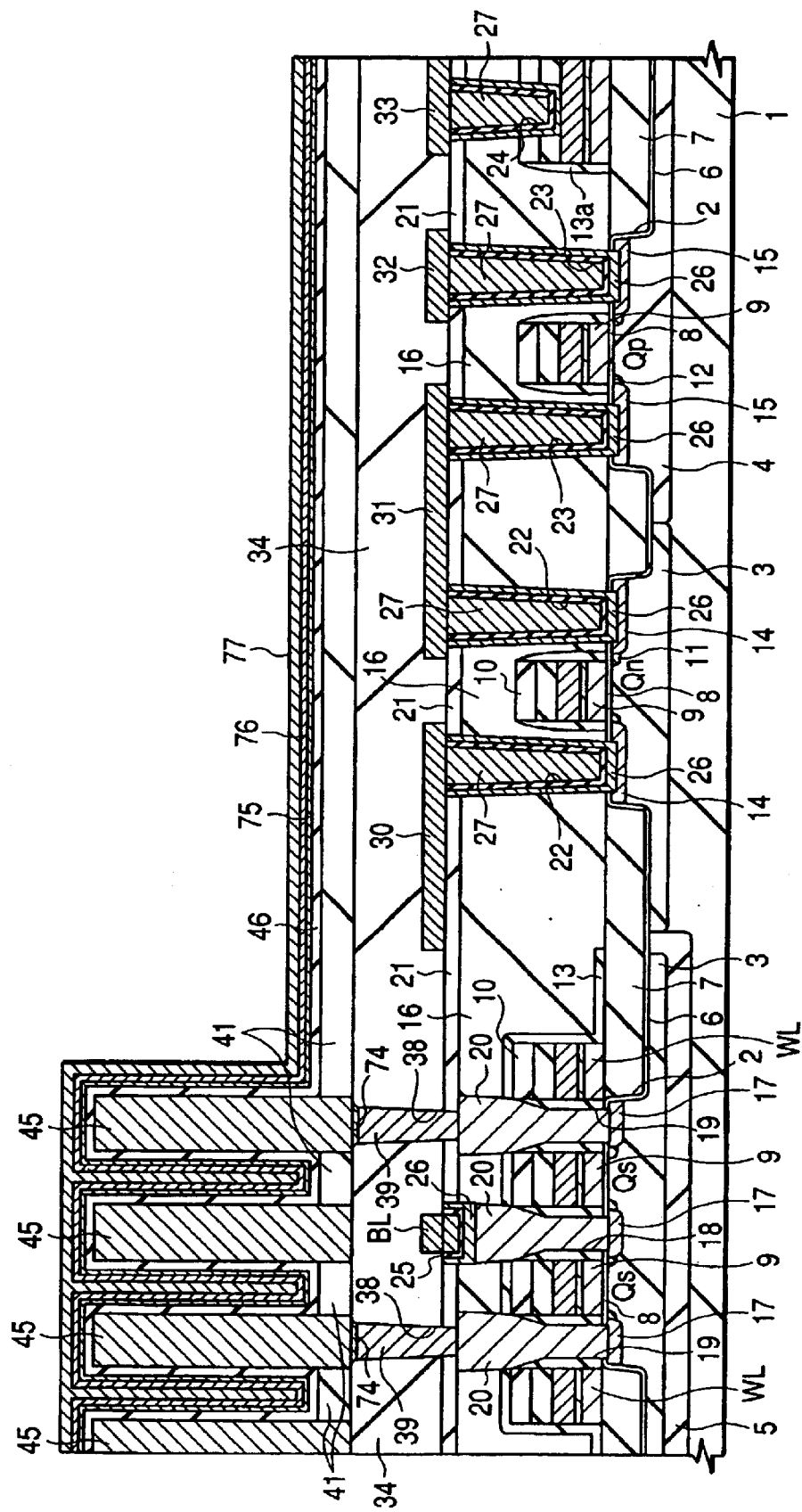
FIG. 30 is a sectional view showing step-wise still another example of the method of production of the DRAM according to Embodiment 1.

The first and second embodiments given above represent the case where the recess between the adjacent lower electrodes 45, or the recess due to the cylindrical shape of the lower electrode 67, is buried by the ruthenium film 47 or the ruthenium film 69 serving as the first layer. However, the tungsten film serving as the second layer may be used for burying the recess as shown in FIGS. 28 to 30. In other words, after the BST film 46 is formed, the ruthenium film 75 is formed by CVD in the same way as in the first and second embodiments as shown in FIG. 28. Next, sputtering is conducted to form the tungsten film 76 as shown in FIG. 29. Since the sputtering process is employed to form this tungsten film 76, degradation of the BST film 46 resulting from the reducing atmosphere such as hydrogen does not occur. Thereafter, the CVD process is conducted to form the tungsten film 77 as shown in FIG. 30, thereby burying the recess. When the CVD process is conducted to form the tungsten film 77, the processing atmosphere is a reducing atmosphere, However, the tungsten film 76 functions as a blocking film and prevents degradation of the BST film 46. The subsequent process steps are the same as those of the first embodiment. This method can be applied likewise to the second embodiment The foregoing embodiments employ ruthenium as the material of the lower electrodes 45 and 67. However, it is possible to use the films of precious metal, their silicide or oxide films, their compounds films such as a platinum film and a ruthenium silicide film, or an SRO film. Even when such a material is used for the lower electrode 45 or 46, the BST film having a high dielectric constant can be applied to the capacitor insulating film.

In the foregoing embodiments, the BST film 46 or 68 is typically used as the capacitor insulating film, but an STO film or a tantalum oxide film may be used, too.

The foregoing embodiments represent the ruthenium film 47, 69 as the first layer of the upper electrode 49, 71. However, it is possible to use films of precious metals, their silicide films or oxide films, or their compound films, such as a platinum film and a ruthenium silicide film, or an SRO film. When the capacitor insulating film uses a tantalum oxide film, the titanium nitride film can be used for the first layer.

The foregoing embodiments represent the tungsten film 48, 70 as the second layer of the upper electrode 49, 71. However, it is possible to use films of metals of the Groups IVb, Vb and VIb, their nitride films, silicide films or compound films, such as a titanium film, a tantalum film, a tungsten nitride film, a titanium nitride film, a tantalum nitride film, a titanium aluminum nitride film, a titanium silicon nitride film or a tantalum silicon nitride film. Even when such films are used, they can satisfy various performance requirements, such as oxidation resistance in the oxidizing atmosphere, evaporation resistance, etching resistance in the etching atmosphere of the silicon oxide film, electric conductivity, oxygen non-suction property, and so forth, and can provide similar effects to those of the foregoing embodiments.

The upper electrode 49, 71 in the foregoing embodiments is typically the laminate film of the ruthenium film 47, 69 and the tungsten film 48, 70, but a titanium nitride film may be formed further in the laminate film. The titanium nitride film exhibits a blocking performance to hydrogen and its absorbing property and can prevent hydrogen from reaching the capacitor insulating film (such as the BST film) after the capacitor is formed. Consequently, the capacitor performance and reliability can be kept high.

The foregoing embodiments represent the case where the invention is applied to a DRAM, but the invention can be applied broadly to semiconductor integrated circuit devices containing a DRAM, such as a system LSI.

The effects obtained by the typical features disclosed in this application are briefly as follows.

The present invention can provide a semiconductor integrated circuit device in which the conduction reliability between the capacitor upper electrode and the plug connected to the upper wire can be kept at a high level, and in which connection defects do not occur. Furthermore, the resistance of the capacitor upper electrode can be reduced.

What is claimed is:

1. A method of producing a semiconductor integrated circuit device comprising the steps of:
   (a) forming bit lines and a first layer wring over a MISFET on a main plane of a semiconductor substrate through a first inter-layer insulating film, forming a second inter-layer insulating film and an electrode-forming insulating film, and etching holes in said electrode-forming insulating film;
   (b) forming a metal or a metal compound on an inside of said holes, and then forming cylindrical first electrodes by forming a metal film or a metal compound film covering the inner wall of said holes;
   (c) depositing a dielectric capacitance insulating film to cover said first electrodes, and depositing further a ruthenium film by a CVD method and a conductor layer by a sputtering method;
   (d) patterning said ruthenium film and conductor layers to form second electrodes; and
   (e) depositing a third inter-layer insulating film covering said second electrodes, and forming a first connection hole reaching said second electrode and a second connection hole reaching said first layer wiring, by etching,
   wherein said third inter-layer insulating film comprises a silicon oxide film, and
   wherein said conductor layer and said first layer wiring are comprised of a material having a lower etching rate than said ruthenium film under a condition where the silicon oxide film is etched.

2. A method of producing a semiconductor integrated circuit device according to claim 1, wherein, after said second conductive layer is etched, said ruthenium film is etched by using said conductive layer, that is patterned, as a mask.

3. A method of producing a semiconductor integrated circuit device according to claim 1, wherein said metal or metal compound comprises a tungsten film.

4. A method of producing a semiconductor integrated circuit device including the steps of:
   (a) forming first electrodes on a first insulating film formed on a main plane of a semiconductor substrate;
   (b) forming a capacitance insulating film over said first electrode;
   (c) forming second electrodes over said capacitance insulating film;
   (d) forming a second insulating film on said second electrodes;
   (e) forming an opening for exposing a part of said second electrodes into said second insulating film by using photoresist film as a mask;
   (f) ashing said photoresist film; and
   (g) forming a conductor layer inside said opening;
   wherein the formation step of said second electrode includes the steps of:
      (i) forming a ruthenium film by a chemical vapor phase growing method containing oxygen over said capacitance insulating film; and
      (ii) forming a metal layer not containing oxygen over said ruthenium film,
   wherein said ruthenium film directly contacts to said metal layer.

5. A method of producing a semiconductor integrated circuit device according to claim 4, wherein said metal layer comprises a tungsten film or a tungsten nitride film.

6. A method of producing a semiconductor integrated circuit device according to claim 4, wherein said metal layer is formed by a sputtering method.

7. A method of producing a semiconductor integrated circuit device including the steps of:
   (a) forming a plurality of mutually spaced-apart first electrodes over a first insulating film formed on a main plane of a semiconductor substrate;
   (b) forming a capacitance insulating film over said first electrodes:
   (c) forming continuous second electrodes with respect to a plurality of said first electrodes, over said capacitance insulating film;
   (d) forming a second insulating film in order to cover said second electrodes;
   (e) forming a hole for exposing a part of said second electrodes into said second insulating film by using photoresist film as a mask;
   (f) ashing said photoresist film; and
   (g) forming a conductor layer inside said hole; p2 wherein the formation step of said second electrodes includes the steps of:
      (i) forming a ruthenium film over said capacitance insulating film; and
      (ii) forming a metal layer having a greater film thickness than said ruthenium film over said ruthenium film, and said metal layer has a lower resistivity than said ruthenium film,
   wherein said metal layer has higher oxidation resistance than said ruthenium film, and
   wherein said ruthenium film has a larger internal stress than said metal layer has.

8. A method of producing a semiconductor integrated circuit device according to claim 7, wherein said metal layer is a tungsten film or a tungsten nitride film.

9. A method of producing a semiconductor integrated circuit device according to claim 7, wherein said ruthenium film comprises a first ruthenium film formed by a sputtering method and a second ruthenium film formed by a chemical vapor phase growing method over said first ruthenium film.

10. A method of producing a semiconductor integrated circuit device including the steps of:
    (a) forming a plurality of mutually spaced-apart first electrodes over a first insulating film formed on a main plane of a semiconductor substrate;
    (b) forming a capacitance insulating film over said first electrodes; and
    (c) forming a continuous second electrode with respect to a plurality of said first electrodes, over said capacitance insulating film; wherein: the formation step of said second electrode includes the steps of:
       (i) forming a ruthenium film over said capacitance insulating film in such a fashion as to provide said ruthenium film within the spaces between said mutually spaced-apart first electrodes by using a CVD method; and
       (ii) forming metal layer including tungsten over said first metal layer by using a sputtering method;
    wherein said metal layer has higher oxidation resistance than said ruthenium film.

11. A method of producing a semiconductor integrated circuit device according to claim 10, wherein the film thickness of said metal layer is greater than that of said ruthenium film.

12. A method of producing a semiconductor integrated circuit device according to claim 10, wherein said metal layer is a tungsten film or a tungsten nitride film.

13. A method of producing a semiconductor integrated circuit device according to claim 10, wherein said ruthenium film comprises a first ruthenium film formed by a sputtering method and a second ruthenium film formed by a chemical vapor phase growing method over said first ruthenium film.

* * * * *